US012696643B2

(12) United States Patent
Lee et al.

(10) Patent No.: US 12,696,643 B2
(45) Date of Patent: Jul. 28, 2026

(54) DISPLAY PANEL AND ELECTRONIC APPARATUS INCLUDING THE SAME

(71) Applicant: Samsung Display Co., Ltd., Yongin-si (KR)

(72) Inventors: Dong-Hoon Lee, Yongin-si (KR); Jangmi Kang, Yongin-si (KR); Myunghoon Park, Yongin-si (KR); Byungchang Yu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 406 days.

(21) Appl. No.: 18/542,977

(22) Filed: Dec. 18, 2023

(65) Prior Publication Data

US 2024/0215358 A1    Jun. 27, 2024

(30) Foreign Application Priority Data

Dec. 22, 2022    (KR) ........................ 10-2022-0181266

(51) Int. Cl.
*H10K 59/131* (2023.01)
*H10K 59/80* (2023.01)

(52) U.S. Cl.
CPC ........... *H10K 59/131* (2023.02); *H10K 59/87* (2023.02)

(58) Field of Classification Search
CPC ...... H10K 59/131; H10K 59/87; H10K 59/00; H10K 59/353; H10K 59/121; H10K 59/123; H10K 50/81; H10K 50/82; H10K 71/851
See application file for complete search history.

(56) References Cited

U.S. PATENT DOCUMENTS

| | | | |
|---|---|---|---|
| 9,450,140 B2 | 9/2016 | Jo et al. | |
| 11,404,512 B2 | 8/2022 | Kim et al. | |
| 12,219,828 B2 * | 2/2025 | Hong ................... | H10K 59/126 |
| 2022/0336573 A1 | 10/2022 | Chen et al. | |
| 2024/0040857 A1 * | 2/2024 | Peng ................... | H10K 59/123 |
| 2025/0072270 A1 * | 2/2025 | Huang ................ | H10K 59/121 |
| 2025/0160160 A1 * | 5/2025 | Liu ....................... | G09G 3/3208 |

FOREIGN PATENT DOCUMENTS

| | | |
|---|---|---|
| CN | 111584591 | 8/2020 |
| CN | 112908261 | 6/2021 |
| CN | 114512524 | 5/2022 |
| KR | 10-1174877 | 8/2012 |
| KR | 10-2020-0097371 | 8/2020 |

* cited by examiner

*Primary Examiner* — J. E. Schoenholtz
(74) *Attorney, Agent, or Firm* — Sughrue Mion, PLLC

(57) ABSTRACT

The present disclosure provides a display panel and an electronic apparatus including the same. The display panel includes a first pixel including a first light emitting part in a first area and a first pixel driver in a second area, a second pixel including a second light emitting part in the second area and a second pixel driver in the second area, a first connection line connecting the first light emitting part and the first pixel driver, and a second connection line connecting the second light emitting part and the second pixel driver, wherein the first and second light emitting parts include a first electrode, an intermediate layer on the first electrode, and a second electrode on the intermediate layer, and the first and second connection lines include a driver connection part and an emission connection part spaced apart from the driver connection part.

20 Claims, 24 Drawing Sheets

DISPLAY PANEL AND ELECTRONIC APPARATUS INCLUDING THE SAME

CROSS-REFERENCE TO RELATED APPLICATION(S)

This application claims priority to and benefits of Korean Patent Application No. 10-2022-0181266 under 35 U.S.C. § 119, filed on Dec. 22, 2022, in the Korean Intellectual Property Office, the entire contents of which are incorporated herein by reference.

BACKGROUND

1. Technical Field

Embodiments relate to a display panel including areas having different light transmittances and an electronic apparatus including the display panel.

2. Description of the Related Art

The electronic apparatus may include various electronic components such as a display panel and an electronic optical module. The electronic optical module may include a camera, an infrared sensor, or a proximity sensor. The electronic optical module may be disposed under the display panel. Light transmittance of some areas of the display panel may be higher than light transmittance of other partial areas of the display panel. The electronic optical module may receive an optical signal or output an optical signal through an area having high light transmittance.

SUMMARY

Embodiments provide a display panel including an area having high light transmittance capable of transmitting an optical signal and an electronic apparatus including the display panel.

However, embodiments of the disclosure are not limited to those set forth herein. The above and other embodiments will become more apparent to one of ordinary skill in the art to which the disclosure pertains by referencing the detailed description of the disclosure given below.

In an embodiment, a display panel may include: a first pixel including a first light emitting part disposed in a first area and a first pixel driver disposed in a second area different from the first area; a second pixel including a second light emitting part disposed in the second area and a second pixel driver disposed in the second area; a first connection line connecting the first light emitting part and the first pixel driver; and a second connection line connecting the second light emitting part and the second pixel driver, wherein each of the first light emitting part and the second light emitting part includes a first electrode, an intermediate layer disposed on the first electrode and including a light emitting material, and a second electrode disposed on the intermediate layer, each of the first connection line and the second connection line includes: a driver connection part connected to a corresponding pixel driver of the first pixel driver and the second pixel driver; and an emission connection part spaced apart from the driver connection part and connected to the second electrode, and the first area has a light transmittance higher than a light transmittance of the second area.

In an embodiment, the first pixel driver and the second pixel driver may not overlap the first area in a plan view.

In an embodiment, the emission connection part of the first connection line may be disposed along a boundary between the first area and the second area.

In an embodiment, the emission connection part of the first connection line may be disposed in the first area.

In an embodiment, the first connection line may overlap the first area in the plan view.

In an embodiment, the first electrode may be an anode, and the second electrode may be a cathode.

In an embodiment, each of the first connection line and the second connection line may have an undercut shape in a cross-sectional view.

In an embodiment, the second electrode of the first light emitting part may contact a side surface of the first connection line, and the intermediate layer of the first light emitting part may be spaced apart from the side surface of the first connection line.

In an embodiment, the display panel may further include a separator disposed between the first light emitting part and the second light emitting part, wherein the second electrode of the first light emitting part and the second electrode of the second light emitting part may be separated from each other by the separator.

In an embodiment, a shape of the separator disposed in the first area in a plan view and a shape of the separator disposed in the second area in the plan view may be different from each other.

In an embodiment, the number of second electrodes per unit area in the first area may be smaller than the number of second electrodes per unit area in the second area.

In an embodiment, the first connection line may be connected to a driving transistor of the first pixel driver, and the second connection line may be connected to a driving transistor of the second pixel driver.

In an embodiment, the first electrode of the first light emitting part may be integral with the first electrode of the second light emitting part.

In an embodiment, the first electrode of the first light emitting part may include a plurality of patterns spaced apart from each other and a connection pattern connecting the plurality of patterns to each other, the connection pattern and the plurality of patterns disposed on different layers, wherein the first electrode of the second light emitting part may be connected to the connection pattern.

In an embodiment, the display panel may further include a third pixel including a third light emitting part disposed in the first area and a third pixel driver disposed in a peripheral area and connected to the third light emitting part.

In an embodiment, electronic apparatus includes: a display panel including a first area and a second area adjacent to the first area; and an electronic optical module overlapping the first area in a plan view, wherein the display panel includes: a first pixel including a first light emitting part disposed in the first area and a first pixel driver disposed in the second area; a second pixel including a second light emitting part disposed in the second area and a second pixel driver disposed in the second area; a first connection line connecting the first light emitting part and the first pixel driver, the first connection line comprising a first emission connection part electrically connected to the first light emitting part; and a second connection line connecting the second light emitting part and the second pixel driver, the second connection line comprising a second emission connection part electrically connected to the second light emitting part, and each of the first and second emission connection parts has an undercut shape in a cross-sectional view.

In an embodiment, the first emission connection part may be arranged along a boundary between the first area and the second area, and the first and second connection lines may not overlap the first area in the plan view.

In an embodiment, the first emission connection part may be disposed in the first area, and the first connection line may overlap the first area in the plan view.

In an embodiment, an anode of the first light emitting part and an anode of the second light emitting part may be integral with each other.

In an embodiment, an anode of the first light emitting part may include a plurality of patterns spaced apart from each other and a connection pattern connecting the plurality of patterns to each other, the connection pattern and the plurality of patterns disposed on different layers, and an anode of the second light emitting part may be connected to the connection pattern.

BRIEF DESCRIPTION OF THE DRAWINGS

The accompanying drawings are included to provide a further understanding of the invention, and are incorporated in and constitute a part of this specification. The drawings illustrate embodiments and, together with the description, serve to explain principles of the invention. In the drawings.

DETAILED DESCRIPTION OF THE EMBODIMENTS

Figure 1:
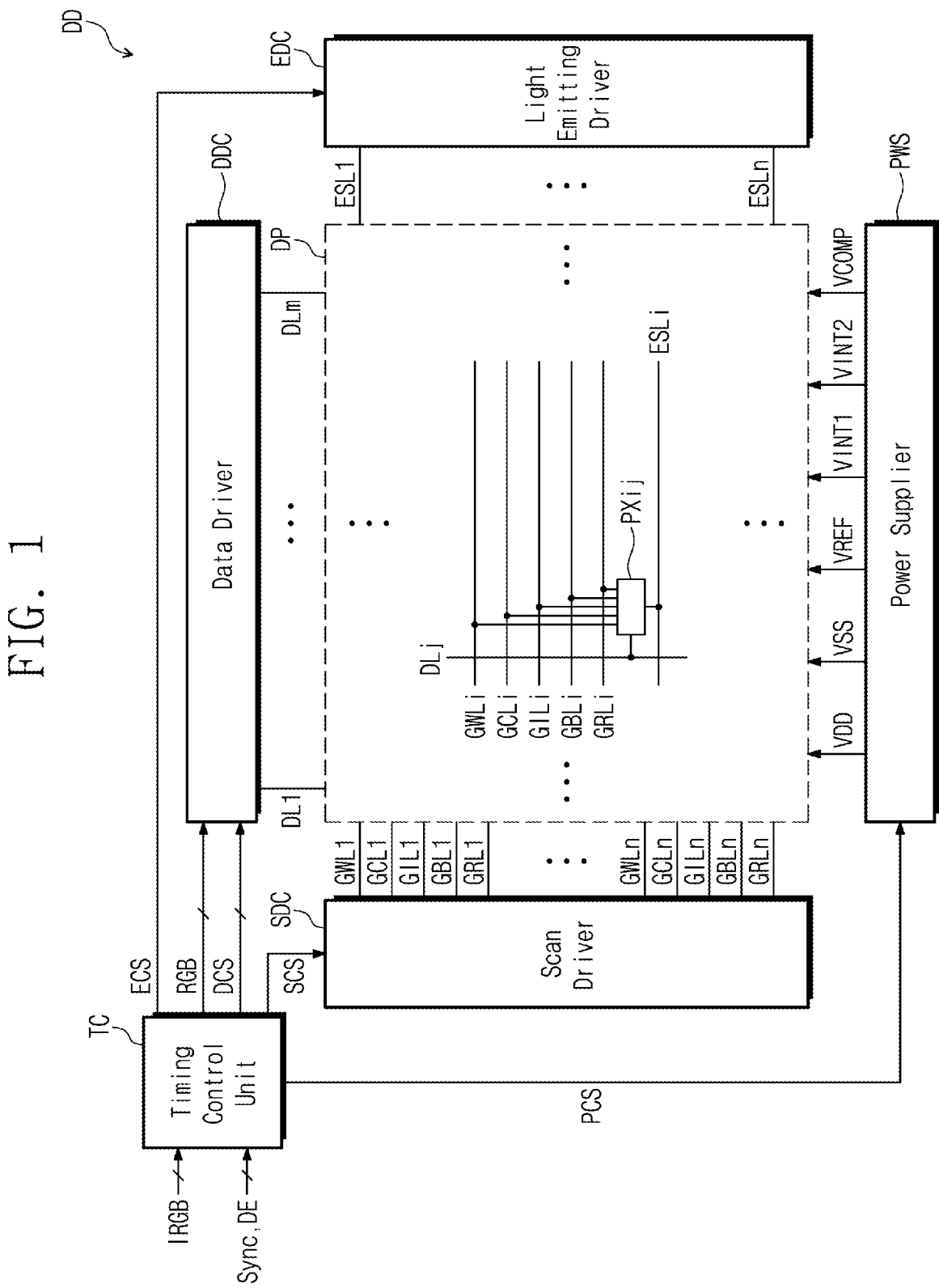
FIG. 1 is a schematic block diagram of a display device according to an embodiment.

In the following description, for the purposes of explanation, numerous specific details are set forth in order to provide a thorough understanding of various embodiments or implementations of the invention. As used herein, "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the scope of the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element or a layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the axis of the first direction DR1, the axis of the second direction DR2, and the axis of the third direction DR3 are not limited to three axes of a rectangular coordinate system, such as the X, Y, and Z-axes, and may be interpreted in a broader sense. For example, the axis of the first direction DR1, the axis of the first direction DR2, and the axis of the first direction DR3 may be perpendicular to one another, or may represent different directions that are not perpendicular to one another. For the purposes of this disclosure, "at least one of A and B" may be understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Hereinafter, embodiments will be described with reference to the drawings.

FIG. 1 is a schematic block diagram of a display device DD according to an embodiment. Referring to FIG. 1, the display device DD may include a display panel DP, panel drivers SDC, EDC, and DDC, a power supplier PWS, and a timing control unit TC. In an embodiment, the display panel DP is described as a light emitting display panel. The light emitting display panel may include an organic light emitting display panel, an inorganic light emitting display panel, or a quantum dot light emitting display panel. In embodiments as described below, an organic light emitting display panel will be described as an example. The panel drivers SDC, EDC, and DDC may include a scan driver SDC, a light emitting driver EDC, and a data driver DDC.

The display panel DP may include scan lines GWL1 to GWLn, GCL1 to GCLn, GIL1 to GILn, GBL1 to GBLn, and GRL1 to GRLn, emission lines ESL1 to ESLn, and data lines DL1 to DLm. The display panel DP may include pixels connected to the scan lines GWL1 to GWLn, GCL1 to GCLn, GIL1 to GILn, GBL1 to GBLn, and GRL1 to GRLn, the emission lines ESL1 to ESLn, and the data lines DL1 to DLm. Here, m and n are integers greater than 1.

For example, the pixels PXij (where i and j are integers greater than 1) disposed on the i-th horizontal line (or the i-th pixel row) and the j-th vertical line (or the j-th pixel column) may be connected to the i-th first scan line GWLi (or write scan line), the i-th second scan line GCLi (or compensation scan line), the i-th third scan line GILi (or first initialization scan line), the i-th 4th scan line GBLi (or second initialization scan line), the i-th 5th scan line GRLi (or reset scan line), the j-th data line DLj, and the i-th emission line ESLi.

The pixel PXij may include emission elements, transistors, and capacitors. The pixel PXij may receive a first power supply voltage VDD, a second power supply voltage VSS, a third power supply voltage VREF (or reference voltage), a fourth power supply voltage VINT1 (or first initialization voltage), a fifth power supply voltage VINT2 (or second initialization voltage), and a sixth power supply voltage VCOMP (or compensation voltage) from a power supplier PWS.

The voltage values of the first power supply voltage VDD and the second power supply voltage VSS may be set so that current may flow through the emission element to emit light. For example, the first power supply voltage VDD may be set to a higher voltage than the second power supply voltage VSS.

The third power supply voltage VREF may be a voltage for initializing a gate electrode of a driving transistor included in the pixel PXij. The third power supply voltage VREF may be used to implement a certain grayscale based on a voltage difference with the data signal. For example, the third power supply voltage VREF may be set to a certain voltage within a voltage range of the data signal.

The fourth power supply voltage VINT1 may be a voltage for initializing a capacitor included in the pixel PXij. The fourth power supply voltage VINT1 may be set to a voltage lower than the third power supply voltage VREF. For example, the fourth power supply voltage VINT1 may be set to a voltage lower than a difference between the third power supply voltage VREF and the threshold voltage of the driving transistor. However, embodiments are not limited thereto.

The fifth power supply voltage VINT2 may be a voltage for initializing a cathode of an emission element included in the pixel PXij. The fifth power supply voltage VINT2 may be set to a voltage lower than the first power supply voltage VDD or the fourth power supply voltage VINT1, or may be set to a voltage similar to or equal to the third power supply voltage VREF, but embodiments are not limited thereto, and the fifth power supply voltage VINT2 may be set to a voltage similar to or equal to the first power supply voltage VDD.

The sixth power supply voltage VCOMP may supply a certain current to the driving transistor in case that the threshold voltage of the driving transistor is compensated.

In FIG. 1, it is shown that all of the first to sixth power supply voltages VDD, VSS, VREF, VINT1, VINT2, and VCOMP are supplied from the power supplier PWS, but embodiments are not limited thereto. For example, both the first power supply voltage VDD and the second power supply voltage VSS may be supplied regardless of the structure of the pixel PXij, and at least one of the third power supply voltage VREF, the fourth power supply voltage VINT1, the fifth power supply voltage VINT2, and the sixth power supply voltage VCOMP may not be supplied according to the structure of the pixel PXij.

In an embodiment, signal lines connected to the pixel PXij may be set in various ways according to the circuit structure of the pixel PXij.

The scan driver SDC may receive the first control signal SCS from the timing control unit TC, and supply a scan signal to each of the first scan lines GWL1 to GWLn, the second scan lines GCL1 to GCLn, the third scan lines GIL1 to GILn, the fourth scan lines GBL1 to GBLn, and the fifth scan lines GRL1 to GRLn.

The scan signal may be set to a voltage at which transistors receiving the scan signal are turned on. For example, a scan signal supplied to a P-type transistor may be set to a logic low level, and a scan signal supplied to an N-type transistor may be set to a logic high level. Hereinafter, the meaning of "a scan signal is supplied" may be understood as that the scan signal is supplied with a logic level that turns on a transistor controlled by the scan signal.

In FIG. 1, for convenience of description, the scan driver SDC is shown as a single component, but embodiments are not limited thereto. According to the embodiment, in order to supply a scan signal to each of the first scan lines GWL1 to GWLn, the second scan lines GCL1 to GCLn, the third scan lines GIL1 to GILn, the fourth scan lines GBL1 to GBLn, and the fifth scan lines GRL1 to GRLn, scan drivers SDC may be included.

The light emitting driver EDC may supply an emission signal to the emission lines ESL1 to ESLn based on the second control signal ECS. For example, emission signals may be sequentially supplied to the emission lines ESL1 to ESLn.

Transistors connected to the emission lines ESL1 to ESLn may be formed as N-type transistors. For example, emission signals supplied to the emission lines ESL1 to ESLn may be set to a gate-off voltage. Transistors receiving the emission signal may be turned off in case that the emission signal is supplied, and may be turned on in other cases.

The second control signal ECS may include an emission start signal and clock signals, and the light emitting driver EDC may be implemented as a shift register that sequentially generates and outputs a pulse-type emission signal by sequentially shifting a pulse-type emission start signal using clock signals.

The data driver DDC may receive the third control signal DCS and image data RGB from the timing control unit TC. A data driver DDC may convert digital image data RGB into an analog data signal (or a data signal). The data driver DDC may supply data signals to the data lines DL1 to DLm in response to the third control signal DCS.

The third control signal DCS may include a data enable signal, a horizontal start signal, and a data clock signal instructing output of a valid data signal. For example, the data driver DDC may include a shift register that generates a sampling signal by shifting the horizontal start signal in synchronization with the data clock signal, a latch that latches image data RGB in response to a sampling signal, a digital-to-analog converter (or decoder) that converts latched image data RGB (e.g., digital data) into analog data signals, and buffers (or amplifiers) that output data signals to the data lines DL1 to DLm.

The power supplier PWS may supply the first power supply voltage VDD, the second power supply voltage VSS, and the third power supply voltage VREF for driving the pixel PXij to the display panel DP. For example, the power supplier PWS may supply at least one of the fourth power supply voltage VINT1, the fifth power supply voltage VINT2, and the sixth power supply voltage VCOMP to the display panel DP.

As an example, the power supplier PWS may supply the first power supply voltage VDD, the second power supply voltage VSS, the third power supply voltage VREF, the fourth power supply voltage VINT1, the fifth power supply voltage VINT2, and the sixth power supply voltage VCOMP to the display panel DP through the first power supply line VDL (see FIG. 2A), the second power supply line VSL (see FIG. 2A), the third power supply line VRL (or reference voltage line, see FIG. 2A), the fourth power supply line VIL1 (or first initialization voltage line, see FIG. 2A), the fifth power supply line VIL2 (or second initialization voltage line, see FIG. 2A), and the sixth power supply line VCL (or compensation voltage line, see FIG. 2A), respectively.

The power supplier PWS may be implemented as a power management integrated circuit, but embodiments are not limited thereto.

The timing control unit TC may generate a first control signal SCS, a second control signal ECS, a third control signal DCS, and a fourth control signal PCS based on the input image data IRGB, the synchronization signal Sync (e.g., vertical synchronization signal, horizontal synchronization signal, etc.), the data enable signal DE, a clock signal, and the like. The first control signal SCS may be supplied to the scan driver SDC, the second control signal ECS may be supplied to the light emitting driver EDC, the third control signal DCS may be supplied to the data driver DDC, and the fourth control signal PCS may be supplied to the power supplier PWS. The timing control unit TC may rearrange the input image data IRGB to correspond to the arrangement of the pixels PXij in the display panel DP and may generate image data RGB (or frame data).

For example, the scan driver SDC, the light emitting driver EDC, the data driver DDC, the power supplier PWS, and/or the timing control unit TC may be formed (e.g., directly formed) on the display panel DP, or may be provided in the form of a separate driving chip and connected to the display panel DP. For example, at least two of the scan driver SDC, the light emitting driver EDC, the data driver DDC, the power supplier PWS, and the timing control unit TC may be provided as a driving chip (e.g., a single driving chip). For example, a data driver DDC and a timing control unit TC may be provided as a driving chip (e.g., a single driving chip).

In the above, the display device DD according to an embodiment has been described with reference to FIG. 1, but embodiments are not limited thereto. Additional signal lines may be added or omitted according to the configuration of pixels. Also, a connection relationship between one pixel and signal lines may be changed. In case that one of the signal lines is omitted, another signal line may replace the omitted signal line.

Figure 2A:
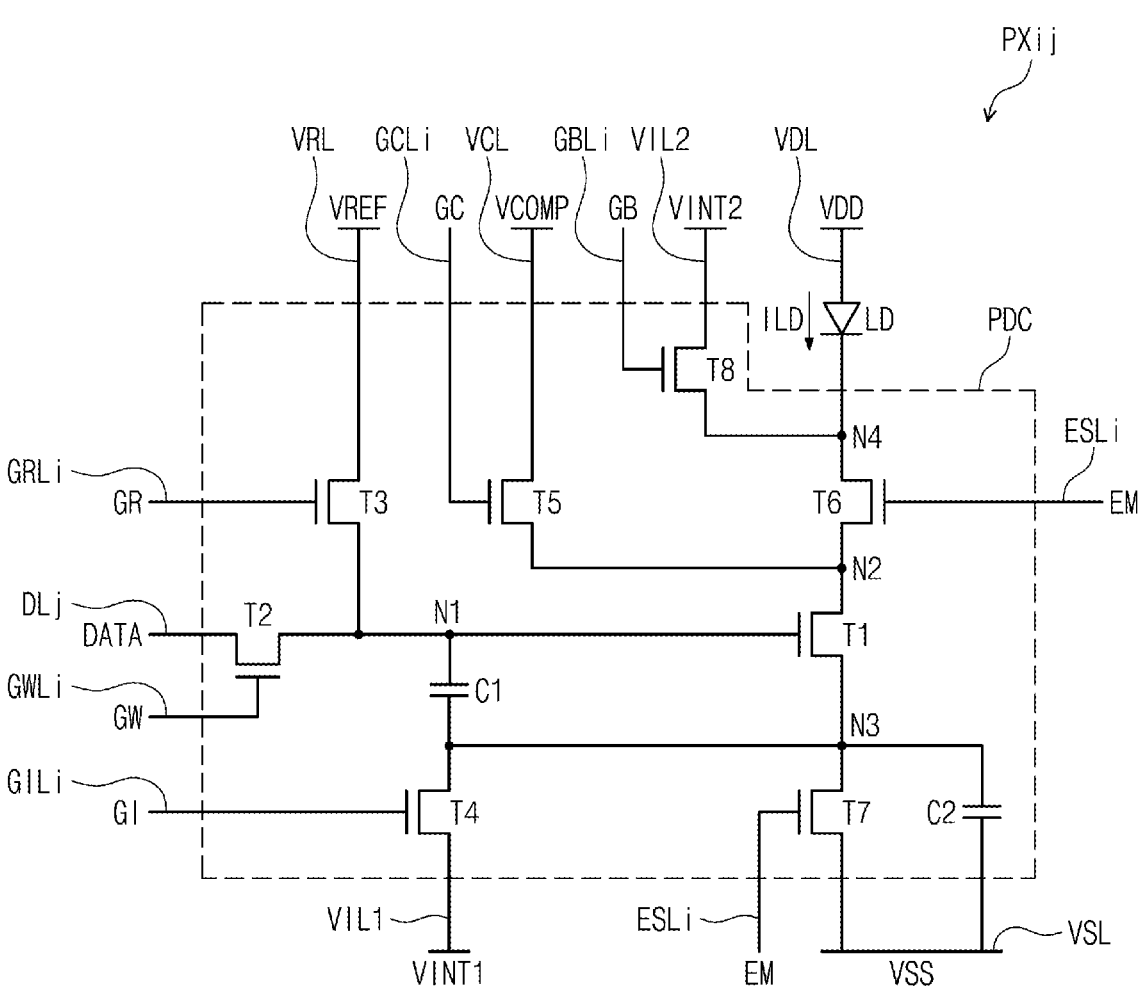
FIGS. 2A and 2B are schematic diagrams of equivalent circuits of pixels according to an embodiment.
Figure 2B:
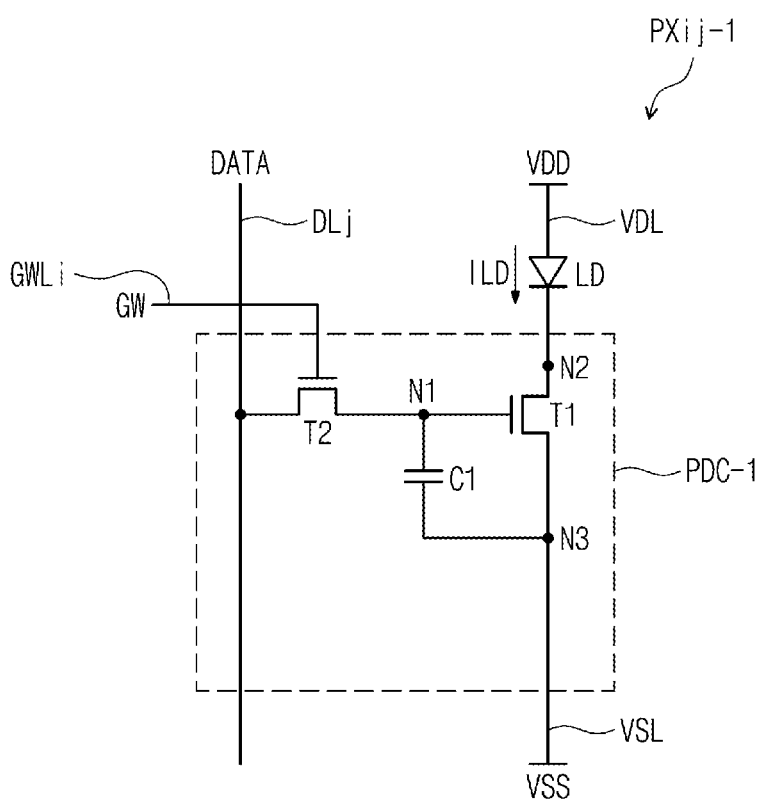

FIGS. 2A and 2B are schematic diagrams of equivalent circuits of pixels PXij and PXij–1 according to an embodiment. FIGS. 2A and 2B illustrate schematic diagrams of equivalent circuits of pixels PXij and PXij–1 connected to the i-th first scan line GWLi (hereinafter referred to as a first scan line) and connected to the j-th data line DLj (hereinafter referred to as a data line).

As shown in FIG. 2A, the pixel PXij may include an emission element LD and a pixel driver PDC. The emission element LD may be connected to a first power supply line VDL and a pixel driver PDC.

The pixel driver PDC may be connected to scan lines GWLi, GCLi, GILi, GBLi, and GRLi, a data line DLj, an emission line ESLi, and power supply voltage lines VDL, VSL, VRL, VIL1, VIL2, and VCL. The pixel driver PDC may include first to eighth transistors T1, T2, T3, T4, T5, T6, T7, and T8, a first capacitor C1, and a second capacitor C2. Hereinafter, a case in which each of the first to eighth transistors T1, T2, T3, T4, T5, T6, T7, and T8 is a N-type transistor will be described as an example. However, embodiments are not limited thereto, and some of the first to eighth transistors T1 to T8 may be N-type transistors and others may be P-type transistors, or each of the first to eighth transistors T1 to T8 may be a P-type transistor.

A gate electrode of the first transistor T1 may be connected to the first node N1. The first electrode of the first transistor T1 may be connected to the second node N2 and the second electrode of the first transistor T1 may be connected to the third node N3. The first transistor T1 may be a driving transistor. The first transistor T1 may control the driving current ILD flowing from the first power supply line VDL to the second power supply line VSL via the emission element LD in response to the voltage of the first node N1. For example, the first power supply voltage VDD may be set to a voltage having a higher potential than the second power supply voltage VSS.

As used herein, "electrically connected between a transistor and a signal line or a transistor and a transistor" means "a transistor in which the source electrode, drain electrode, and gate electrode have an integral shape with the signal line or are connected through a connection electrode".

The second transistor T2 may include a gate electrode connected to the write scan line GWLi, a first electrode connected to the data line DLj, and a second electrode connected to the first node N1. The second transistor T2 may supply the data signal DATA to the first node N1 in response to the write scan signal GW transmitted through the write scan line GWLi. The second transistor T2 may be turned on in case that the write scan signal GW is supplied to the write scan line GWLi to connect (e.g., electrically connect) the data line DLj and the first node N1.

The third transistor T3 may be connected between the first node N1 and the reference voltage line VRL. A first electrode of the third transistor T3 may receive the reference voltage VREF through the reference voltage line VRL, and a second electrode of the third transistor T3 may be connected to the first node N1. In an embodiment, the gate electrode of the third transistor T3 may receive the reset scan signal GR through the i-th fifth scan line GRLi (hereinafter referred to as a fifth scan line). The third transistor T3 may be turned on in case that the reset scan signal GR is supplied to the reset scan line GRLi, and may provide the reference voltage VREF to the first node N1.

The fourth transistor T4 may be connected between the third node N3 and the first initialization voltage line VIL1. The first electrode of the fourth transistor T4 may be connected to the third node N3, and a second electrode of the fourth transistor T4 may be connected to a first initialization voltage line VIL1 providing a first initialization voltage VINT1. The fourth transistor T4 may be referred to as a first initialization transistor. The gate electrode of the fourth transistor T4 may receive the first initialization scan signal GI through the i-th third scan line GILi (hereinafter referred to as a third scan line). The fourth transistor T4 may be turned on in case that the first initialization scan signal GI is supplied to the first initialization scan line GILi to supply the first initialization voltage VINT1 to the third node N3.

The fifth transistor T5 may be connected between the compensation voltage line VCL and the second node N2. The first electrode of the fifth transistor T5 may receive the compensation voltage VCOMP through the compensation voltage line VCL, and the second electrode of the fifth transistor T5 may be connected to the second node N2 and connected (e.g., electrically connected) to the first electrode of the first transistor T1. The gate electrode of the fifth transistor T5 may receive the compensation scan signal GC through the i-th second scan line GCLi (hereinafter referred to as a second scan line). The fifth transistor T5 may be turned on in case that the compensation scan signal GC is supplied to the compensation scan line GCLi to provide the compensation voltage VCOMP to the second node N2, and during the compensation period, the threshold voltage of the first transistor T1 may be compensated.

The sixth transistor T6 may be connected between the first transistor T1 and the emission element LD. For example, the gate electrode of the sixth transistor T6 may receive the emission signal EM through the i-th emission line ESLi (hereinafter referred to as an emission line). The first electrode of the sixth transistor T6 may be connected to the cathode of the emission element LD through the fourth node N4, and the second electrode of the sixth transistor T6 may be connected to the first electrode of the first transistor T1 through the second node N2. The sixth transistor T6 may be referred to as a first emission control transistor. In case that the emission signal EM is supplied to the emission line ESLi, the sixth transistor T6 may be turned on and may connect (e.g., electrically connect) the emission element LD to the first transistor T1.

The seventh transistor T7 may be connected between the second power supply line VSL and the third node N3. The first electrode of the seventh transistor T7 may be connected to the second electrode of the first transistor T1 through the third node N3, and the second electrode of the seventh transistor T7 may receive the second power supply voltage VSS through the second power supply line VSL. A gate electrode of the seventh transistor T7 may be connected (e.g., electrically connected) to the emission line ESLi. The seventh transistor T7 may be referred to as a second emission control transistor. The seventh transistor T7 may be turned on in case that the emission signal EM is supplied to the emission line ESLi, and may connect (e.g., electrically connect) the second electrode of the first transistor T1 to the second power supply line VSL.

In an embodiment, the sixth transistor T6 and the seventh transistor T7 may be connected to the same emission line ESLi and turned on through the same emission signal EM and this is shown as an example, and the sixth transistor T6 and the seventh transistor T7 may be independently turned on by different signals that are distinct from each other. In the pixel driver PDC according to an embodiment, either the sixth transistor T6 or the seventh transistor T7 may be omitted.

The eighth transistor T8 may be connected between the second initialization voltage line VIL2 and the fourth node N4. For example, the eighth transistor T8 may include a gate electrode connected to the i-th fourth scan line GBLi (hereinafter referred to as a fourth scan line), a first electrode connected to the second initialization voltage line VIL2, and a second electrode connected to the fourth node N4. The eighth transistor T8 may be referred to as a second initialization transistor. The eighth transistor T8 may supply the second initialization voltage VINT2 to the fourth node N4 corresponding to the cathode of the emission element LD in response to the second initialization scan signal GB transmitted through the second initialization scan line GBLi. A cathode of the emission element LD may be initialized by the second initialization voltage VINT2.

In an embodiment, some of the second to eighth transistors T2, T3, T4, T5, T6, T7, and T8 may be simultaneously turned on through the same scan signal. For example, the eighth transistor T8 and the fifth transistor T5 may be simultaneously turned on through the same scan signal. For example, the eighth transistor T8 and the fifth transistor T5 may be operated by the same compensation scan signal GC. The eighth transistor T8 and the fifth transistor T5 may be simultaneously turned on/off by the same compensation scan signal GC. For example, the compensation scan line GCLi and the second initialization scan line GBLi may be substantially provided as a single scan line. Accordingly, an initialization operation of the cathode of the emission element LD and a threshold voltage compensation operation of the first transistor T1 may be performed at the same timing. However, this is shown as an example but embodiments are not limited thereto.

According to an embodiment, the initialization operation of the cathode of the emission element LD and the threshold voltage compensation operation of the first transistor T1 may be performed by applying the same power supply voltage. For example, the compensation voltage line VCL and the second initialization voltage line VIL2 may be substantially provided as a single power supply voltage line. For example, the initialization operation of the cathode of the emission element LD and the threshold voltage compensation operation of the driving transistor T1 may be performed with a power supply voltage, and thus the driver design may be simplified. However, this is shown as an example but embodiments are not limited thereto.

The first capacitor C1 may be disposed between the first node N1 and the third node N3. The first capacitor C1 may store charge corresponding to a voltage difference between the voltage of the first node N1 and the voltage of the third node N3. The first capacitor C1 may be referred to as a storage capacitor.

The second capacitor C2 may be disposed between the third node N3 and the second power supply line VSL. For example, an electrode of the second capacitor C2 may be connected to the second power supply line VSL receiving the second power supply voltage VSS, and another electrode of the second capacitor C2 may be connected to the third node N3. The second capacitor C2 may store charge corresponding to a voltage difference between the second power supply voltage VSS and the voltage of the third node N3. The second capacitor C2 may be referred to as a hold capacitor. The second capacitor C2 may have a higher storage capacity than the first capacitor C1. Accordingly, the second capacitor C2 may minimize the voltage change of the third node N3 in response to the voltage change of the first node N1.

In an embodiment, the emission element LD may be connected to the pixel driver PDC through the fourth node N4. The emission element LD may include an anode connected to the first power supply line VDL and a cathode opposite to the anode. In an embodiment, the cathode of the emission element LD may be connected to the pixel driver PDC through the fourth node N4. For example, in the pixel PXij according to an embodiment, a connection node to which the emission element LD and the pixel driver PDC are connected may be a fourth node N4, and the fourth node N4 may correspond to a connection node between the first electrode of the sixth transistor T6 and the cathode of the emission element LD. Accordingly, the potential of the fourth node N4 may substantially correspond to the potential of the cathode of the emission element LD.

For example, the anode of the emission element LD may be connected to the first power supply line VDL such that a first power supply voltage VDD, which is a constant voltage, is applied thereto, and the cathode of the emission element LD may be connected to the first transistor T1 through the sixth transistor T6. For example, in an embodiment in which the first to eighth transistors T1 to T8 are N-type transistors, the potential of the third node N3 corresponding to the source electrode of the driving transistor, the first transistor T1, may not be directly affected by the characteristics of the emission element LD. Therefore, in case that deterioration of the emission element LD occurs, the effect on the gate-source voltage (Vgs) of the transistors forming the pixel driver PDC (e.g., the driving transistor) may be reduced. For example, since the amount of change in driving current ILD due to deterioration of the emission element LD is reduced, afterimage defects of the display panel due to an increase in usage time may be reduced and lifespan of the display panel may be improved.

As shown in FIG. 2B, the pixel PXij–1 may include a pixel driver PDC–1 including two transistors T1 and T2 and one capacitor C1. The pixel driver PDC–1 may be connected to an emission element LD, a write scan line GWLi, a data line DLj, and a second power supply line VSL. The pixel driver PDC–1 shown in FIG. 2B may correspond to the case where the third to eighth transistors T3 to T8 and the second capacitor C2 are omitted from the pixel driver PDC shown in FIG. 2A.

Each of the first and second transistors T1 and T2 may be N-type or P-type transistor. In an embodiment, each of the first and second transistors T1 and T2 will be described as an N-type transistor.

The first transistor T1 may include a gate electrode connected to the first node N1, a first electrode connected to the second node N2, and a second electrode connected to the third node N3. The second node N2 may be a node disposed toward the first power supply line VDL, and the third node N3 may be a node disposed toward the second power supply line VSL. The first transistor T1 may be connected to the emission element LD through the second node N2 and connected to the second power supply line VSL through the third node N3. The first transistor T1 may be a driving transistor.

The second transistor T2 may include a gate electrode receiving the write scan signal GW through the write scan line GWLi, a first electrode connected to the data line DLj, and a second electrode connected to the first node N1. The second transistor T2 may supply the data signal DATA to the first node N1 in response to the write scan signal GW transmitted through the write scan line GWLi.

The capacitor C1 may include an electrode connected to the first node N1 and an electrode connected to the third node N3. The capacitor C1 may store charge corresponding to a voltage difference between the voltage of the data signal DATA transmitted to the first node N1 and the voltage of the third node N3.

The emission element LD may include an anode and a cathode. In an embodiment, the anode of the emission element LD may be connected to the first power supply line VDL, and the cathode of the emission element LD may be connected to the pixel driver PDC–1 through the second node N2. In an embodiment, the cathode of the emission element LD may be connected to the first transistor T1. The emission element LD may emit light in response to the amount of current flowing through the first transistor T1 of the pixel driver PDC–1.

In an embodiment in which the first and second transistors T1 and T2 are N-type transistors, the second node N2 to which the cathode of the emission element LD and the pixel driver PDC–1 are connected may correspond to the drain electrode of the first transistor T1. For example, a change in the gate-source voltage (Vgs) of the first transistor T1 due to the emission element LD may be prevented. Accordingly, since the amount of change in driving current ILD due to deterioration of the emission element LD is reduced, after-image defects of the display panel due to an increase in usage time may be reduced and lifespan of the display panel may be improved.

FIGS. 2A and 2B show circuits for pixel drivers PDC and PDC–1 according to an embodiment, and in relation to a display panel according to an embodiment, in case that the circuit is connected to the cathode of the emission element LD, the number or arrangement of transistors and the number or arrangement of capacitors may be designed in various ways, and this is not limited to any one embodiment.

Figure 3:
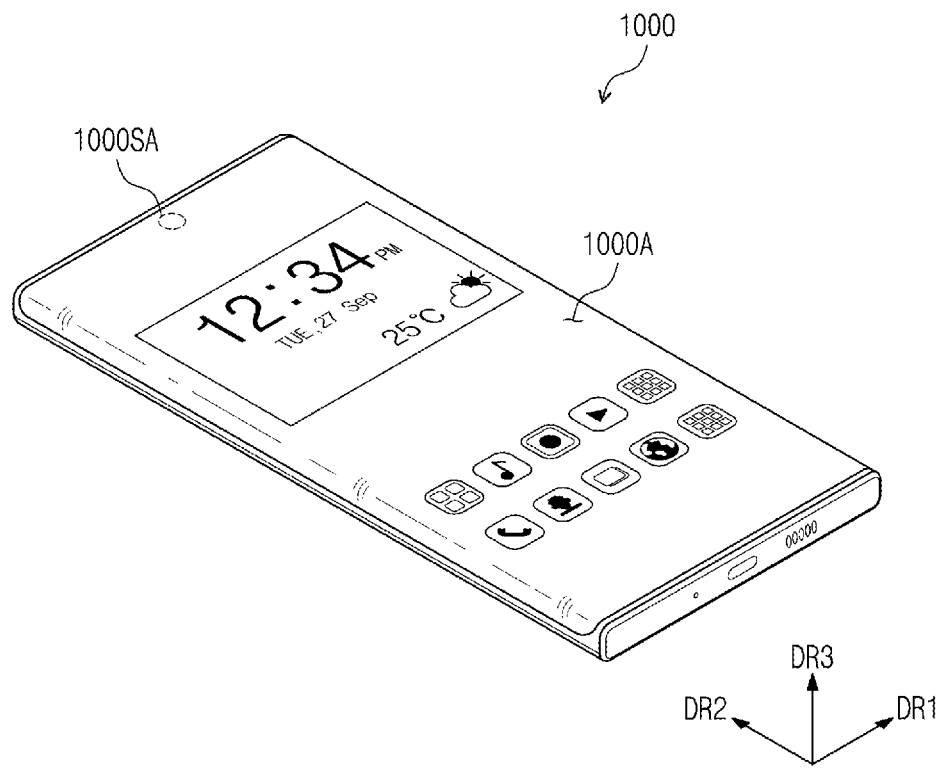
FIG. 3 is a schematic perspective view of an electronic apparatus according to an embodiment.

FIG. 3 is a schematic perspective view of an electronic apparatus 1000 according to an embodiment. In FIG. 3, the electronic apparatus 1000 shows a mobile phone as an example. However, embodiments are not limited thereto, and the electronic apparatus 1000 may be a tablet, a monitor, a television, a car navigation system, a game machine, or a wearable device.

The electronic apparatus 1000 may display an image through the display area 1000A. The display area 1000A may include a plane defined by the first direction DR1 and the second direction DR2. The display area 1000A may further include curved surfaces, which are bent from at least two sides of the plane, respectively. However, the shape of the display area 1000A is not limited thereto. For example, the display area 1000A may include only the plane, or the display area 1000A may further include at least two or more, for example, four curved surfaces, which are bent from four sides of the plane, respectively.

A part of the display area 1000A may be defined as a sensing area 1000SA. Although a sensing area 1000SA is illustrated in FIG. 1 as an example, the number of sensing areas 1000SA is not limited thereto. The sensing area 1000SA may be a part of the display area 1000A, but may have higher optical signal light transmittance than other areas of the display area 1000A. Accordingly, the sensing area 1000SA may display an image and pass an optical signal at the same time.

The electronic apparatus 1000 may include an electronic optical module disposed in an area overlapping the sensing area 1000SA. The electronic optical module may receive an optical signal provided from the outside through the sensing area 1000SA or output an optical signal through the sensing area 1000SA. For example, the electronic optical module may be a camera module, a sensor that measures distance between an object and a mobile phone, such as a proximity sensor, a sensor that recognizes a part of the user's body (e.g., fingerprint, iris, or face), or a small lamp that outputs light, but embodiments are not limited thereto.

The thickness direction of the electronic apparatus 1000 may be the third direction DR3, which is a normal direction of the display area 1000A. The front (or upper) and rear (or lower) surfaces of the members forming the electronic apparatus 1000 may be defined with respect to the third direction DR3.

Figure 4A:
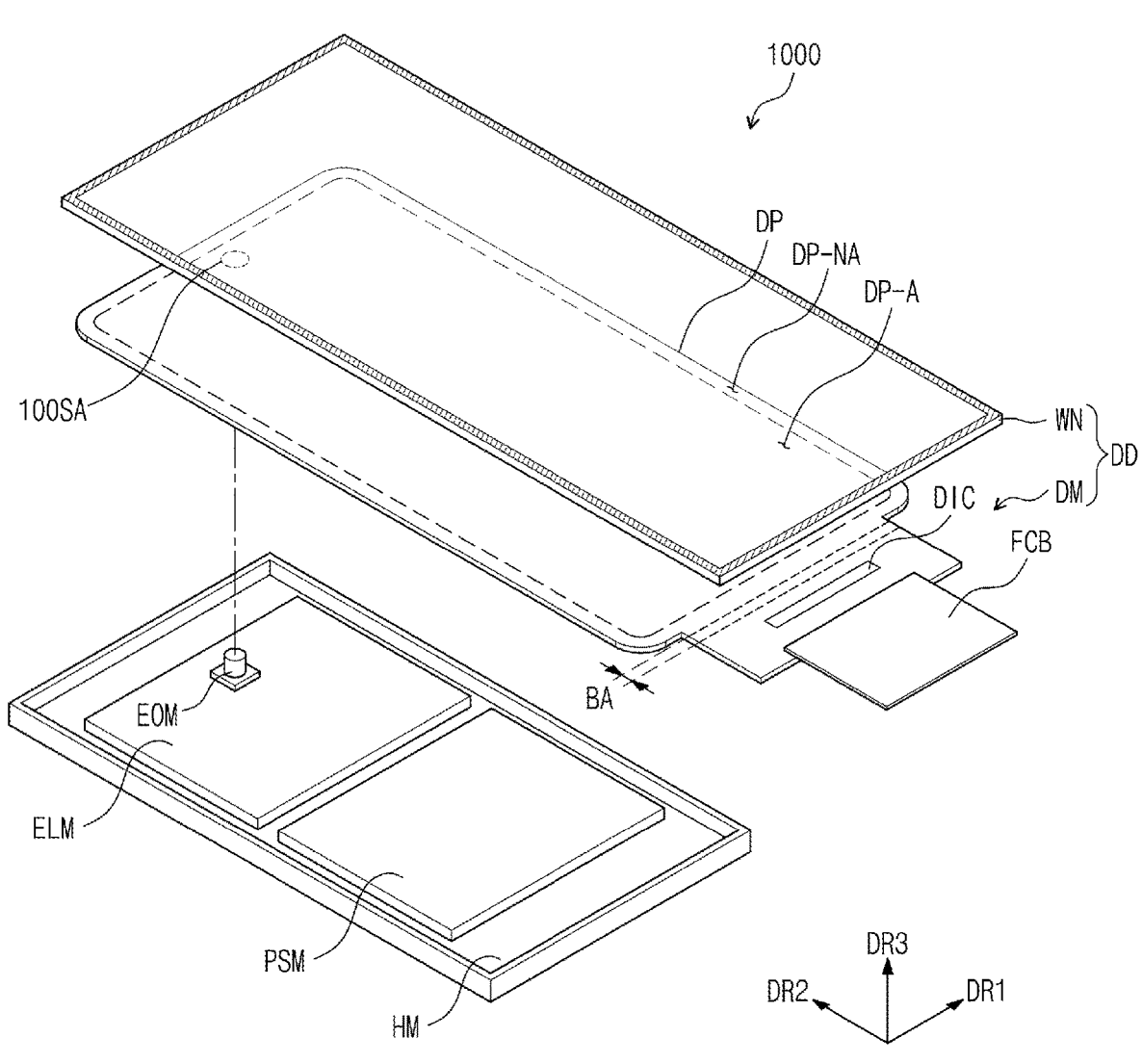
FIG. 4A is an exploded schematic perspective view of an electronic apparatus according to an embodiment.
Figure 4B:
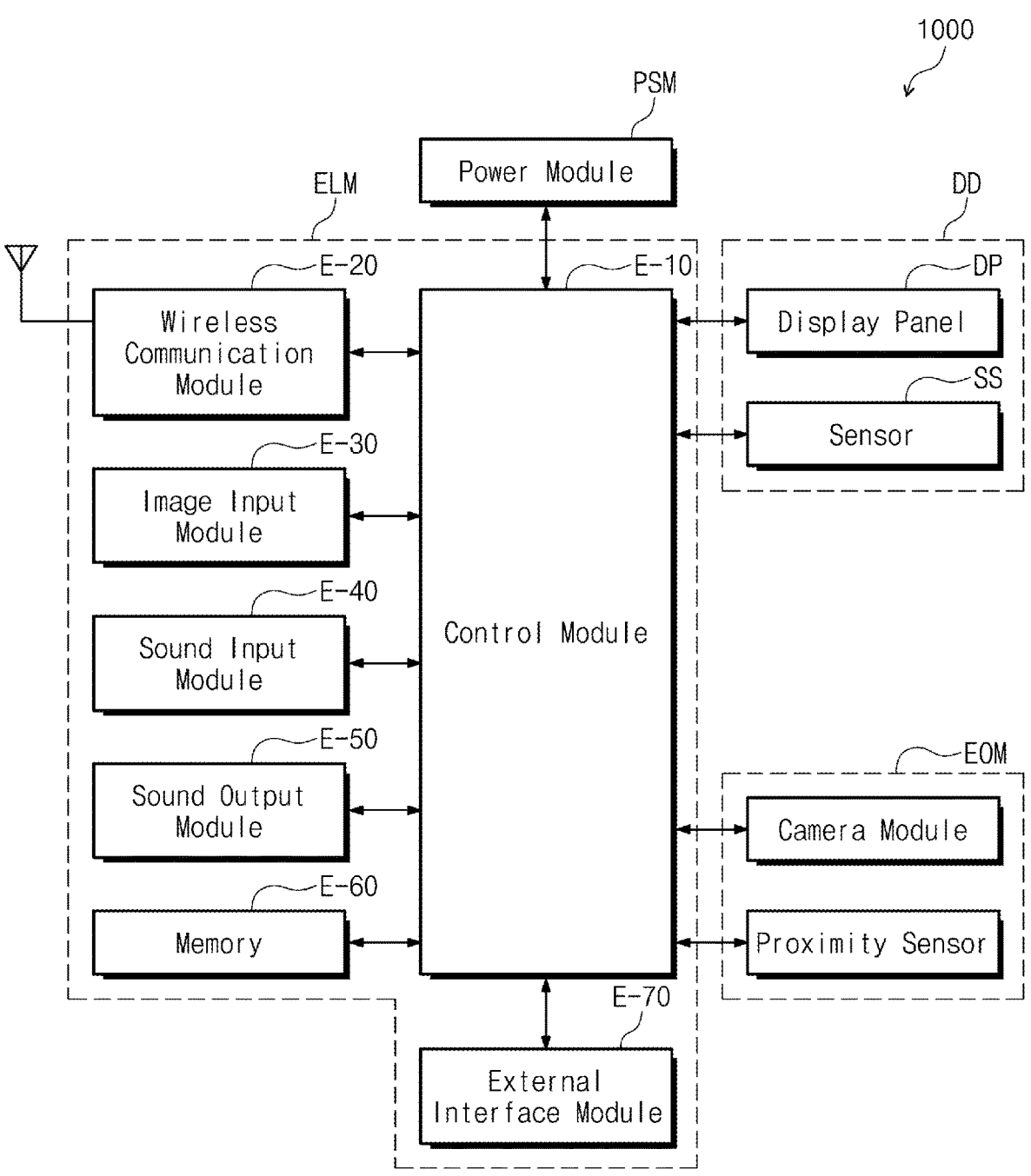
FIG. 4B is a schematic block diagram of an electronic apparatus according to an embodiment.

FIG. 4A is an exploded schematic perspective view of an electronic apparatus 1000 according to an embodiment. FIG. 4B is a schematic block diagram of an electronic apparatus 1000 according to an embodiment.

As shown in FIGS. 4A and 4B, the electronic apparatus 1000 may include a display device DD, an electronic module ELM, an electronic optical module EOM, a power module PSM, and a housing HM. The electronic apparatus 1000 may further include additional components.

The display device DD may generate an image and may detect at least an external input. The display device DD may include a window WN and a display module DM.

The window WN may provide a front surface of the electronic apparatus 1000. The window WN may include a glass film or synthetic resin film as a base film. The window WN may further include an anti-reflection layer or an anti-fingerprint layer. The window WN may further include a light blocking pattern overlapping the peripheral area DP-NA of the display panel DP. The light blocking pattern may define a bezel of the electronic apparatus 1000. The window WN and the display module DM may be coupled to each other through an adhesive layer.

The display module DM may include at least the display panel DP. Although only the display panel DP is shown among the stacked structures of the display module DM in FIG. 4A, the display module DM may further include a plurality of components disposed above the display panel DP. A detailed description of the stacked structure of the display module DM will be given below.

The display panel DP may include a display area DP-A and a peripheral area DP-NA. The display area DP-A may correspond to the display area 1000A shown in FIG. 3. A pixel PX (see FIG. 5) may be disposed in the display area DP-A. An emission element may be disposed in the display area DP-A, and an emission element may not be disposed in the peripheral area DP-NA.

The display panel DP may include a sensing area 100SA corresponding to the sensing area 1000SA of FIG. 3. The sensing area 100SA may have a lower resolution than other areas of the display area DP-A. A detailed description of the sensing area 100SA will be given below.

As shown in FIG. 4A, the driving chip DIC may be disposed on the peripheral area DP-NA of the display panel DP. A flexible printed circuit board FCB may be coupled to the peripheral area DP-NA of the display panel DP. The flexible printed circuit board FCB may be connected to the main circuit board. The main circuit board may be an electronic component forming the electronic module ELM. The bending area BA of the peripheral area DP-NA may be bent so that the flexible printed circuit board FCB may be disposed below the display area DP-A.

The driving chip DIC may include driving elements for driving the pixel PX, for example, the data driver DDC (see FIG. 1). Although FIG. 4A shows a structure in which the driving chip DIC is mounted on the display panel DP, embodiments are not limited thereto. For example, the driving chip DIC may be mounted on the flexible printed circuit board FCB.

Referring to FIG. 4A, the electronic module ELM and the power module PSM may be accommodated in the housing HM. The housing HM may be combined with the display device DD, e.g., the window WN, to accommodate the other modules.

As shown in FIG. 4B, the display device DD may include a display panel DP and a sensor SS. The sensor SS may include any one or more of an input sensor, an antenna sensor, and a fingerprint sensor.

The electronic module ELM may include a control module E-10, a wireless communication module E-20, an image input module E-30, a sound input module E-40, a sound output module E-50, a memory E-60, and an external interface module E-70. The electronic module ELM may include a main circuit board, and the modules may be mounted on the main circuit board or connected (e.g., electrically connected) to the main circuit board through a flexible circuit board. The electronic module ELM may be connected (e.g., electrically connected) to the power module PSM.

The control module E-10 may control the overall operation of the electronic apparatus 1000. For example, the control module E-10 may activate or deactivate the display device DD according to a user input. The control module E-10 may control the image input module E-30, the sound input module E-40, the sound output module E-50, and the like according to the user input. The control module E-10 may include at least one microprocessor.

The wireless communication module E-20 may transmit/receive wireless signals to/from other terminals using a Bluetooth or Wi-Fi line. The wireless communication module E-20 may transmit/receive voice signals using a general communication line. The wireless communication module E-20 may include antenna modules.

The image input module E-30 may process the image signal and may convert the processed image signal into image data that are displayed on the display device DD. The sound input module E-40 may receive an external sound signal through a microphone in a recording mode or voice recognition mode and may convert it into electrical voice data. The sound output module E-50 may convert sound data received from the wireless communication module E-20 or sound data stored in the memory E-60 and may output the converted sound data to the outside.

The external interface module E-70 may function as an interface connected to an external charger, a wired/wireless data port, a card (e.g., a memory card, and a SIM/UIM card) socket, or the like.

The power module PSM may supply power necessary for the overall operation of the electronic apparatus 1000. The power module PSM may include a conventional battery device.

The electronic optical module EOM may be an electronic component that outputs or receives an optical signal. The electronic optical module EOM may include a camera module and/or a proximity sensor. The camera module may capture external images through the sensing area 1000SA.

Figure 5A:
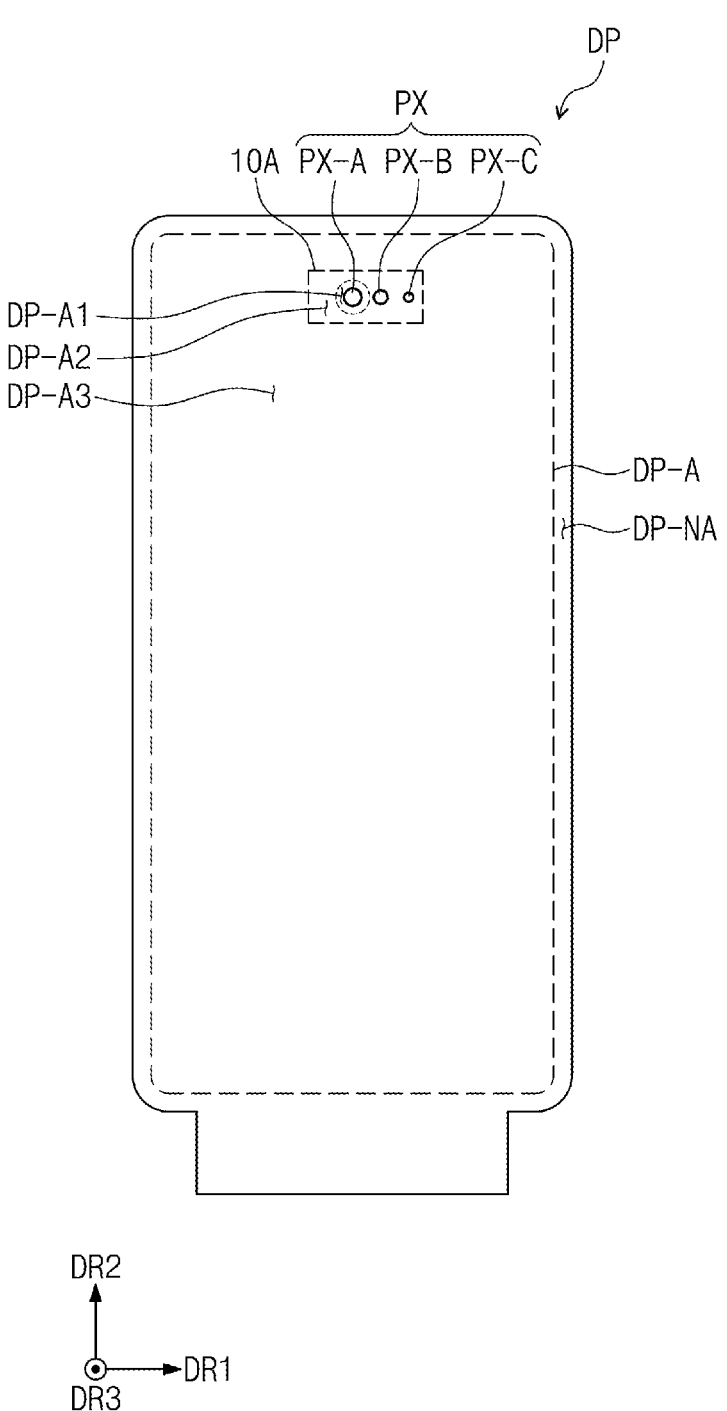
FIGS. 5A and 5B are schematic plan views schematically illustrating a display panel according to an embodiment.
Figure 5B:
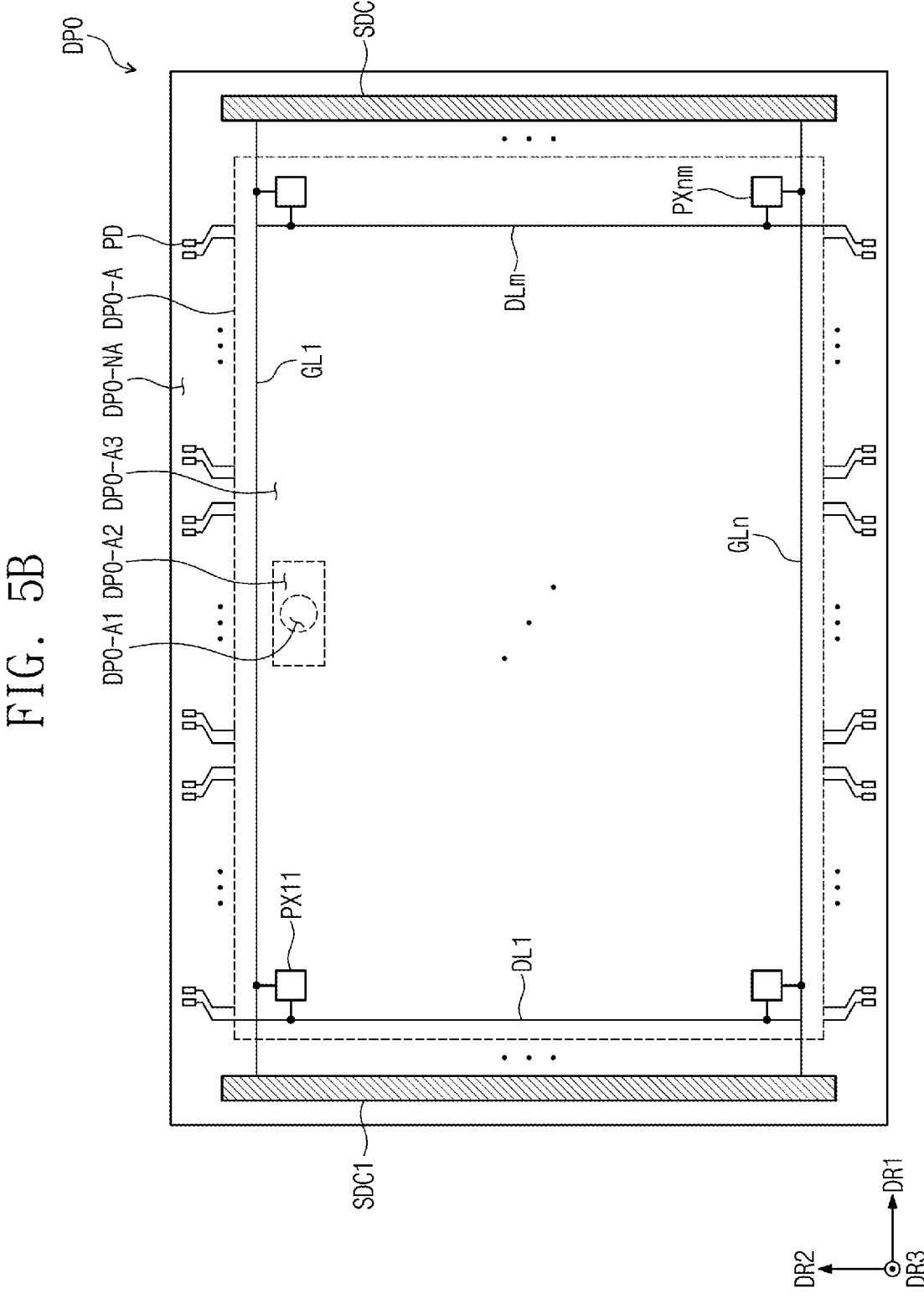

FIGS. 5A and 5B are schematic plan views schematically illustrating display panels DP and DP0 according to an embodiment. In each of FIGS. 5A and 5B, some components are omitted. Hereinafter, embodiments will be described with reference to FIGS. 5A and 5B. Referring to FIG. 5A, the display panel DP may include a display area DP-A and a peripheral area DP-NA. The peripheral area DP-NA may be adjacent to the display area DP-A and may surround at least a portion of the display area DP-A. However, this is shown as an example, and the peripheral area DP-NA may be disposed on a side of the display area DP-A or may be omitted, but embodiments are not limited thereto.

The display area DP-A may include a first area DP-A1, a second area DP-A2, and a third area DP-A3. The first area DP-A1 may correspond to the sensing area 1000SA shown in FIG. 3. In an embodiment, the first area DP-A1 is shown in the shape of a circle, but may have various shapes, such as a polygon, an ellipse, a figure having at least one curved side, or an irregular shape, and embodiments are not limited thereto.

The display panel DP may include pixels PX. The display panel DP may include a first group of pixels PX-A (or first area pixels) including a light emitting part disposed in the first area DP-A1, a second group of pixels PX-B (or second area pixels) including a light emitting part disposed in the second area DP-A2, and a third group of pixels PX-C (or third area pixels) including a light emitting part disposed in the third area DP-A3. Positions of the first group of pixels PX-A, the second group of pixels PX-B, and the third group of pixels PX-C shown in FIG. 5A are shown based on the position of the corresponding light emitting part. The light emitting part may correspond to a light emitting area among emission elements LD (see FIG. 2A or 2B).

Each of the first group of pixels PX-A, the second group of pixels PX-B, and the third group of pixels PX-C may include pixels. For example, each of the first to third groups of pixels PX-A, PX-B, and PX-C may include a red pixel, a green pixel, and a blue pixel, and may further include a white pixel according to embodiments.

The first area DP-A1, the second area DP-A2, and the third area DP-A3 may be classified according to light transmittance or resolution. Light transmittance and resolution are measured within a reference area.

The light transmittance of the first area DP-A1 may be higher than that of the second area DP-A2 and the third area DP-A3. This is because the occupied area ratio of the light blocking structure described below is lower in the first area DP-A1 than in the second area DP-A2 and the third area DP-A3. The non-occupying area of the light blocking structure corresponds to the transmitting area of the light signal. The light blocking structure may include a conductive pattern, a pixel defining film, a pixel defining pattern, and the like, which will be described below.

The third area DP-A3 may have higher resolution than the first area DP-A1 and the second area DP-A2. In the third area DP-A3, a greater number of emission elements may be disposed within the reference area (or the same area/unit area) as compared to the first area DP-A1 and the second area DP-A2. However, this is described as an example, and the third area DP-A3 may have substantially the same resolution as the first area DP-A1 or the second area DP-A2, and this is not limited to any one embodiment.

Based on light transmittance, the first area DP-A1 may be a first light transmittance area, and the second area DP-A2 and the third area DP-A3 may be different parts of the second light transmittance area separated from the first light transmittance area. Light transmittance of the second area DP-A2 and the third area DP-A3 may be substantially the same as each other. In case that the light transmittance of the second area DP-A2 and the third area DP-A3 are different from each other, since the light transmittance of the first area DP-A1 is considerably higher than that of each of the second and third areas DP-A2 and DP-A3, in case that the first area DP-A1 is defined as a first light transmittance area, the second area DP-A2 and the third area DP-A3 may be defined as a second light transmittance area.

Based on resolution, the first area DP-A1 and the second area DP-A2 may be different parts of the first resolution area, and the third area DP-A3 may be a second resolution area distinct from the first resolution area. The number of emission elements per reference area of the first area DP-A1 may be substantially the same as the number of emission elements per reference area of the second area DP-A2.

In an embodiment, the scan driver SDC (see FIG. 1) and the data driver DDC (see FIG. 1) may be mounted on the display panel DP. In an embodiment, a scan driver SDC may be disposed in a display area DP-A, and a data driver DDC may be disposed in a peripheral area DP-NA. The data driver DDC may be provided in the form of a separate driving chip DIC (see FIG. 4A) independent of the display panel DP and connected to the display panel DP. However, this is described as an example, and the data driver DDC may be formed in the same process as the scan driver SDC to configure the display panel DP, but embodiments are not limited thereto.

The scan driver SDC may overlap at least a portion of the light emitting parts EP (see FIG. 6C) disposed in the display area DP-A in a plan view. As the scan driver SDC is placed in the display area DP-A, as compared to a conventional display panel in which a scan driver is disposed in the peripheral area, the area of the peripheral area DP-NA may be reduced, and a display device with a thin bezel may be readily implemented.

Unlike described with reference to FIG. 5A, in another example, the scan driver SDC may be provided in two distinct parts. The two scan drivers SDC may be disposed left and right with the center of the display area DP-A therebetween. In another example, two or more scan drivers SDC may be provided, and the number of scan drivers SDC is not limited to any one embodiment. In another example, the data driver DDC may be disposed in the display area DP-A. For example, some of the light emitting parts EP disposed in the display area DP-A may overlap the data driver DDC in a plan view.

As shown in FIG. 5B, the display panel DP0 may have a shape in which a length extending in the first direction DR1 is longer than a length extending in the second direction DR2. The display area DP0-A is illustrated as having a rectangular shape having a long side extending in the first direction DR1 and a short side extending in the second direction DR2. The peripheral area DP0-NA is illustrated as having a rectangular frame shape having a long side extending in the first direction DR1 and a short side extending in the second direction DR2.

As shown in FIG. 5B, the display area DP0-A may include a first area DP0-A1, a second area DP0-A2, and a third area DP0-A3. The first area DP0-A1, the second area DP0-A2, and the third area DP0-A3 may correspond to the first area DP-A1, the second area DP-A2, and the third area DP-A3 shown in FIG. 5A, respectively. Hereinafter, redundant descriptions will be omitted for descriptive convenience.

In an embodiment, the display panel DP0 may include scan drivers SDC1 and SDC2. The scan drivers SDC1 and SDC2 are illustrated as including a first scan driver SDC1 and a second scan driver SDC2 spaced apart from each other in the first direction DR1.

The first scan driver SDC1 may be connected to some of the scan lines GL1 to GLn, and the second scan driver SDC2 may be connected to other some of the scan lines GL1 to GLn. For example, the first scan driver SDC1 may be connected to odd-numbered scan lines among the scan lines GL1 to GLn, and the second scan driver SDC2 may be connected to even-numbered scan lines among the scan lines GL1 to GLn.

FIG. 5B shows the pads PD of the data lines DL1 to DLm for descriptive convenience. The pads PD may be defined at end portions of the data lines DL1 to DLm. The data lines DL1 to DLm may be connected to the data driver DDC (see FIG. 1) through the pads PD. For example, pixels PX11 to PXnm may be arranged in the third area DP0-A3.

According to an embodiment, the pads PD may be divided and arranged at positions spaced apart from each other with the display area DP-A therebetween in the peripheral area DP-NA. For example, some of the pads PD may be disposed on the upper side, e.g., on the side adjacent to the first scan line GL1 among the scan lines GL1 to GLn, and other some of the pads PD may be disposed on a lower side, e.g., on a side adjacent to the last scan line GLn among the scan lines GL1 to GLn. In an embodiment, pads PD connected to odd-numbered data lines among the data lines DL1 to DLm may be disposed on the upper side, and pads PD connected to even-numbered data lines among the data lines DL1 to DLm may be disposed on the lower side.

For example, the display panel DP0 may include upper data drivers connected to the pads PD disposed on the upper side and/or lower data drivers connected to the pads PD disposed on the lower side. However, this is illustratively explained, and the display panel DP0 may include an upper data driver connected to the pads PD disposed on the upper side and/or a lower data driver connected to the pads PD disposed on the lower side. For example, the pads PD according to an embodiment may be disposed on a single side of the display panel DP0 and connected to a single data driver, but embodiments are not limited thereto.

As described above in FIG. 5A, in the display panel DP0 of FIG. 5B, a scan driver and/or a data driver may be disposed in the display area DP0-A, and accordingly, some of the light emitting parts disposed in the display area DP0-A may overlap the scan driver and/or the data driver in a plan view. The display panels DP and DP0 according to an embodiment may have various shapes, and may be connected to various types of drivers SDC, SDC1, SDC2, and DDC, but embodiments are not limited thereto.

Figure 6A:
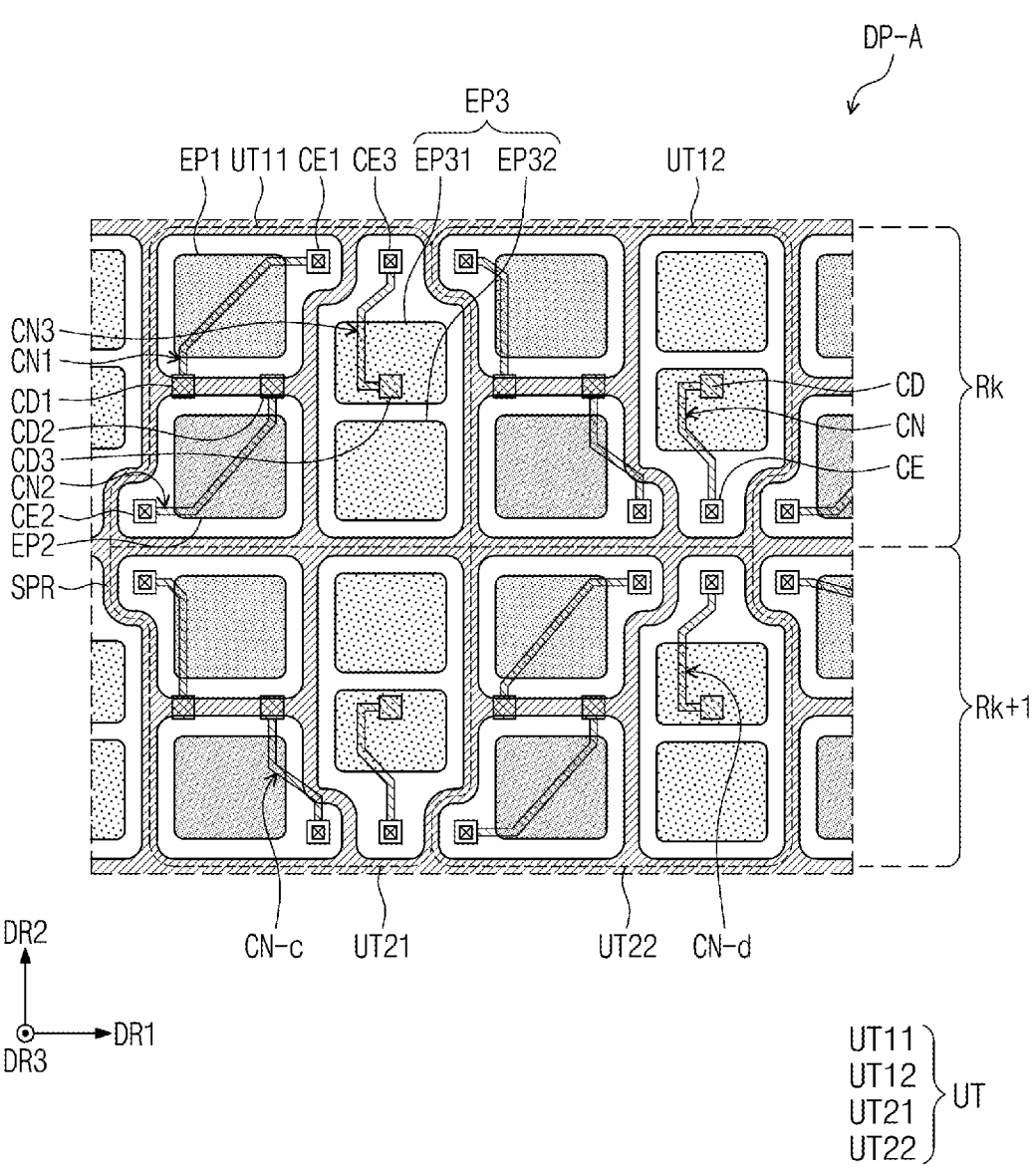
FIGS. 6A to 6C are enlarged schematic plan views of a partial area of a display panel according to an embodiment.
Figure 6B:
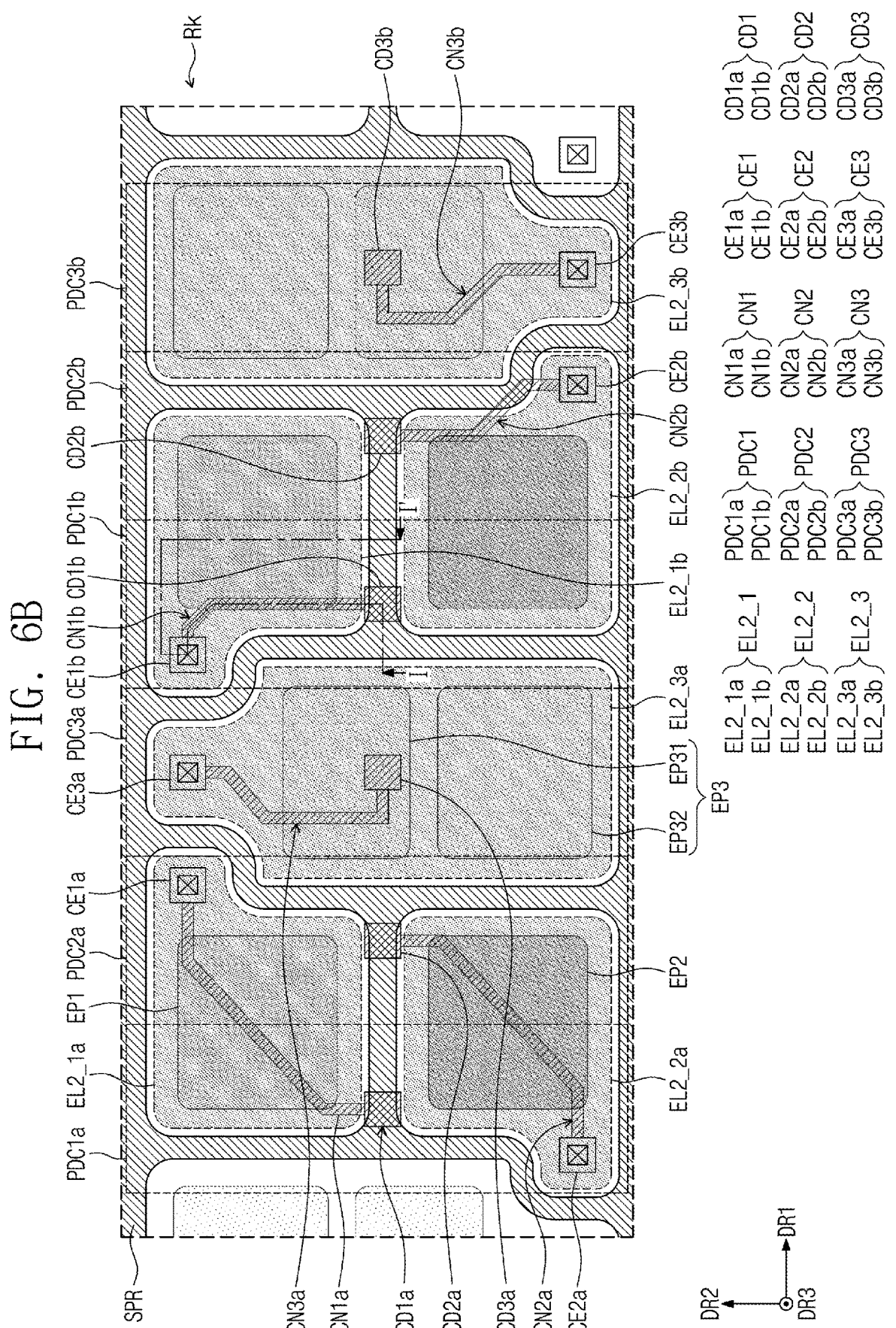
Figure 6C:
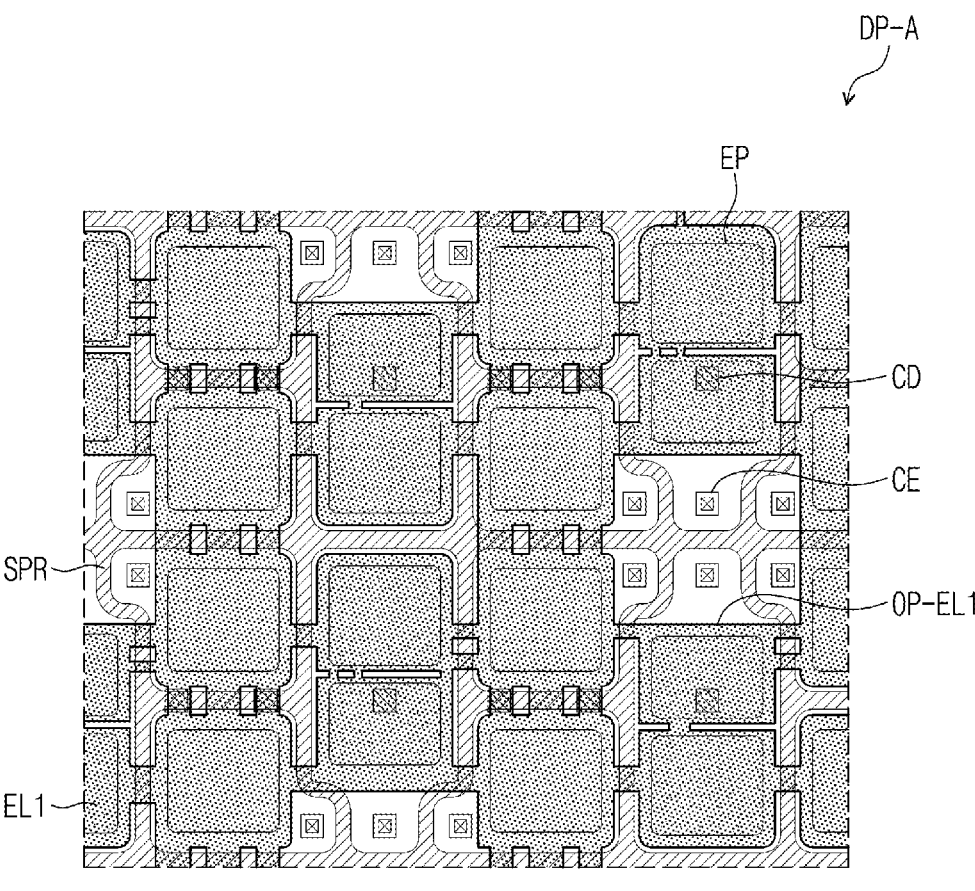

FIGS. 6A to 6C are enlarged schematic plan views of a partial area of a display panel according to an embodiment. FIG. 6A shows an area where a total of four light emitting units UT in 2 rows and 2 columns are disposed, and FIG. 6B shows an enlarged schematic view of a partial area shown in FIG. 6A. In FIG. 6C, some of the components shown in FIG. 6A are omitted or emphasized. Hereinafter, embodiments will be described with reference to FIGS. 6A to 6C.

FIG. 6A shows light emitting units UT11, UT12, UT21, and UT22 in two rows and two columns. The light emitting units of the first row Rk include light emitting units forming the first row and first column light emitting unit UT11 and the first row and second column light emitting unit UT12, and the light emitting units of the second row Rk+1 include light emitting units forming the second row and first column light emitting units UT21 and the second row and second column light emitting units UT22. FIG. 6B shows light emitting parts of the first row Rk. FIGS. 6A to 6C show a separator SPR, light emitting parts EP1, EP2, and EP3 disposed in the area partitioned by the separator SPR, connection lines CN1, CN2, and CN3, a first electrode EL1, and second electrodes EL2_1, EL2_2, and EL2_3 among the components of the display panel.

As described above, each of the light emitting parts EP1, EP2, and EP3 may correspond to a light emitting opening OP-PDL (see FIG. 7) as described below. For example, each of the light emitting parts EP1, EP2, and EP3 may be areas in which light is emitted by the above-described emission element LD, and may correspond to a unit displaying an image displayed on the display panel DP (see FIG. 1). For example, each of the light emitting parts EP1, EP2, and EP3 may correspond to an area defined by a light emitting opening OP-PDL described below, e.g., an area defined by a lower surface of the light emitting opening OP-PDL.

The light emitting parts EP1, EP2, and EP3 may include a first light emitting part EP1, a second light emitting part EP2, and a third light emitting part EP3. The first light emitting part EP1, the second light emitting part EP2, and the third light emitting part EP3 may emit lights of different colors from each other. For example, the first light emitting part EP1 may emit red light, the second light emitting part EP2 may emit green light, and the third light emitting part EP3 may emit blue light, and the combination of colors is not limited thereto. For example, at least two or more of the light emitting parts EP1, EP2, and EP3 may emit light of the same color. For example, all of the first to third light emitting parts EP1, EP2, and EP3 may emit blue light or all of them may emit white light.

For example, among the light emitting parts EP1, EP2, and EP3, the third light emitting part EP3 emitting light emitted by the third emission element may include two sub light emitting parts EP31 and EP32 spaced apart from each other in the second direction DR2. However, this is shown as an example, like the other light emitting parts EP1 and EP2, the third light emitting part EP3 may be provided in a pattern having an integral shape, and at least one of the other light emitting parts EP1 and EP2 may include spaced apart sub light emitting parts, but embodiments are not limited thereto.

In an embodiment, the light emitting parts of the first row Rk may be composed of light emitting parts in which a first row and first column light emitting unit UT11 and a first row and second column light emitting unit UT12 are repeatedly arranged. The light emitting parts of the second row Rk+1 may be composed of light emitting parts having a shape and arrangement axisymmetric with a shape and arrangement of the light emitting parts of the first row Rk with respect to an axis parallel to the first direction DR1. Accordingly, the light emitting parts, which form the first row and first column light emitting unit UT11 and the first row and second column light emitting unit UT12, and the connection parts of the connection line may have a shape and arrangement line-symmetrical with a shape and arrangement of the light emitting parts forming the second row and first column light emitting units UT21 and the second row and second column light emitting units UT22 and the connection parts of connection lines with respect to an axis parallel to the first direction DR1.

Hereinafter, the first row and first column light emitting unit UT11 will be described. FIG. 6B illustrates second electrodes EL2_1 (e.g., EL2_1a and EL2_1b), EL2_2 (e.g., EL2_2a and EL2_2b), and EL2_3 (e.g., EL2_3a and EL2_3b), pixel drivers PDC (e.g., PDC1a, PDC1b, PDC2a, PDC2b, PDC3a, and PDC3b), and connection lines CN (e.g., CN1a, CN1b, CN2a, CN2b, CN3a, and CN3b) for descriptive convenience. The second electrodes EL2_1, EL2_2, and EL2_3 may be electrically disconnected from each other by being separated from each other by the separator SPR. In an embodiment, a light emitting unit UT may include three light emitting parts EP1, EP2, and EP3. Accordingly, the light emitting unit UT may include three second electrodes EL2_1, EL2_2, and EL2_3 (hereinafter referred to as first to third cathodes), three pixel drivers PDC1, PDC2, and PDC3, and three connection lines CN1, CN2, and CN3. However, this is shown as an example, and the number and arrangement of light emitting units UT may be designed in various ways, but embodiments are not limited thereto.

The first to third pixel drivers PDC1, PDC2, and PDC3 may be connected (e.g., electrically connected) to emission elements forming the first to third light emitting parts EP1, EP2, and EP3, respectively. In the description, "connected" includes not only a case of being physically connected by direct contact, but also a case of being electrically connected.

For example, as shown in FIG. 6B, each area in which the pixel drivers PDC1, PDC2, and PDC3 are defined in a plan view may correspond to a unit in which transistor and capacitor elements forming a circuit for driving an emission element of a pixel (the pixel driver PDC in FIG. 2A or the pixel driver PDC–1 in FIG. 2B) are repeatedly arranged.

The first to third pixel drivers PDC1, PDC2, and PDC3 may be sequentially disposed along the first direction DR1. For example, the arrangement positions of the first to third pixel drivers PDC1, PDC2, and PDC3 may be independently designed regardless of the positions or shapes of the first to third light emitting parts EP1, EP2, and EP3.

For example, the first to third pixel drivers PDC1, PDC2, and PDC3 may be disposed in an area defined by being partitioned by a separator SPR, e.g., disposed at a position different from the position at which the first to third cathodes EL2_1, EL2_2, and EL2_3 are disposed, or may be formed to have a shape of an area different from that of the first to third cathodes EL2_1, EL2_2, and EL2_3. In another example, the first to third pixel drivers PDC1, PDC2, and PDC3 may be disposed to overlap positions where the first to third light emitting parts EP1, EP2, and EP3 are disposed, respectively, and may be formed to have an area defined by being partitioned by a separator SPR, for example, an area similar to that of the first to third cathodes EL2_1, EL2_2, and EL2_3.

In an embodiment, each of the first to third pixel drivers PDC1, PDC2, and PDC3 may be shown in a rectangular shape, each of the first to third light emitting parts EP1, EP2, and EP3 may be arranged in a smaller area and a different shape, and the first to third cathodes EL2_1, EL2_2, and EL2_3 are disposed at overlapping positions with the first to third light emitting parts EP1, EP2, and EP3, but are illustrated in irregular shapes.

Accordingly, as shown in FIG. 6B, the first pixel driver PDC1 may be disposed at a position partially overlapping the first light emitting part EP1, the second light emitting part EP2, and other adjacent light emitting parts EP. The second pixel driver PDC2 may be disposed at a position overlapping the first light emitting part EP1, the second light emitting part EP2, and the third light emitting part EP3. The third pixel driver PDC3 may be disposed at a position overlapping the third light emitting part EP3. For example, this is shown as an example, and the positions of the first to third pixel drivers PDC1, PDC2, and PDC3 may be designed in various shapes and arrangements independently of the light emitting parts EP1, EP2, and EP3, but embodiments are not limited thereto.

Connection lines CN may be provided and spaced apart from each other. The connection line CN may connect (e.g., electrically connect) a pixel driver PDC and an emission element LD (see FIG. 7). For example, the connection line CN may correspond to a node (see the fourth node N4 in FIG. 2A or the second node N2 in FIG. 2B) where the emission element LD is connected to the pixel driver PDC.

The connection line CN may include a first connection part CE (or emission connection part) and a second connection part CD (or driver connection part). An emission connection part CE may be provided on an end of the connection line CN and a driver connection part CD may be provided on another end of the connection line CN.

The driver connection part CD may be a part of the connection line CN connected to the pixel driver PDC. In an embodiment, a driver connection part CD may be connected to an electrode of a transistor forming a pixel driver PDC. For example, the driver connection part CD may be connected to the drain electrode of the sixth transistor T6 shown in FIG. 2A or the drain electrode of the first transistor T1 shown in FIG. 2B. Accordingly, the position of the driver connection part CD may correspond to the position of the transistor TR (see FIG. 7) physically connected to the connection line CN among the pixel drivers PDC. The emission connection part CE may be a part of the connection line CN connected to the emission element LD. In an embodiment, the emission connection part CE may be connected to the second electrode EL2 (see FIG. 7) (hereinafter referred to as cathode) of the emission element LD.

The light emitting unit UT may include first to third connection lines CN1, CN2, and CN3. The first connection line CN1 may connect an emission element LD forming the first light emitting part EP1 and the first pixel driver PDC1, the second connection line CN2 may connect an emission element LD forming the second light emitting part EP2 and the second pixel driver PDC2, and the third connection line CN3 may connect an emission element LD forming the third light emitting part EP3 and the third pixel driver PDC3.

For example, the first to third connection lines CN1, CN2, and CN3 may connect the first to third cathodes EL2_1, EL2_2, and EL2_3 and the first to third pixel drivers PDC1, PDC2, and PDC3, respectively. The first connection line CN1 may include a first driver connection part CD1 (e.g., CD1a and CD1b) connected to the first pixel driver PDC1 and a first emission connection part CE1 (e.g., CE1a and CE1b) connected to the first cathode EL2_1. The second connection line CN2 may include a second driver connection part CD2 (e.g., CD2a and CD2b) connected to the second pixel driver PDC2 and a second emission connection part CE2 (e.g., CE2a and CE2b) connected to the second cathode EL2_2. The third connection line CN3 may include a third driver connection part CD3 (e.g., CD3a and CD3b) connected to the third pixel driver PDC3 and a third emission connection part CE3 (e.g., CE3a and CE3b) connected to the third cathode EL2_3.

The first to third driver connection parts CD1, CD2, and CD3 may be aligned along the first direction DR1. As described above, the first to third driver connection parts CD1, CD2, and CD3 may correspond to positions of connection transistors forming the first to third pixel drivers PDC1, PDC2, and PDC3, respectively. In a pixel, the connection transistor may be a transistor including a connection node to which a pixel driver PDC and an emission element LD are connected as one electrode, and for example, may correspond to the sixth transistor T6 of FIG. 2A or the first transistor T1 of FIG. 2B. According to an embodiment, regardless of the shape or size of the light emitting part EP1, EP2, and EP3 and the emission light color, it is possible to simply configure and design the shape, position, and arrangement of the pixel driver PDC of all pixels.

In an embodiment, the first to third emission connection parts CE1, CE2, and CE3 may be disposed at positions that do not overlap the light emitting parts EP1, EP2, and EP3 in a plan view. As described below, since the emission connection part CE (see FIG. 7) of the connection line CN is the part where the emission element LD (see FIG. 7) is connected and the tip portion TP (see FIG. 7) is defined, it may be provided at a position that does not overlap the light emitting opening OP-PDL. For example, in each of the cathodes EL2_1, EL2_2, and EL2_3, the emission connection parts CE1, CE2, and CE3 may be disposed at positions spaced apart from the light emitting parts EP1, EP2, and EP3, and to connect with the connection lines CN1, CN2, and CN3 at the position where the emission connection parts CE1, CE2, and CE3 are placed, the cathodes EL2_1, EL2_2, and EL2_3 may include partial areas protruding from the light emitting parts EP1, EP2, and EP3 in a plan view.

For example, to connect to the first connection line CN1 at the position where the first emission connection part CE1 is disposed, the first cathode EL2_1 may include a protruding portion protruding from the first light emitting part EP1 at a position that does not overlap the first light emitting part EP1 and the first emission connection part CE1 may be provided on the protruding portion.

For example, the first driver connection part CD1, which is a position where the first pixel driver PDC1, e.g., the transistor TR, may be connected to the first connection line CN1 may be defined at a position that does not overlap the first light emitting part EP1 in a plan view. According to an embodiment, since the first connection line CN1 is disposed in the first light emitting part EP1, the spaced first cathode EL2_1 and the first pixel driver PDC1 may be readily connected.

For example, the third driver connection part CD3, which is a position where the third pixel driver PDC3, e.g., the transistor TR, is connected to the third connection line CN3 may be defined at a position that does not overlap the third emission connection part CE3 in a plan view and disposed at a position that overlaps the third light emitting part EP3. According to an embodiment, as the third cathode EL2_3 and the third pixel driver PDC3 are connected through the third connection line CN3, in the design of the third pixel driver PDC3, the restriction according to the position or shape of the third light emitting part EP3 may be reduced, so that the degree of freedom of design may be improved.

Referring back to FIG. 6A, the light emitting parts of the second row Rk+1 may be composed of light emitting parts having a shape and arrangement axisymmetric with a shape and arrangement of light emitting parts of the first row light emitting units UT11 and UT12 with respect to an axis parallel to the first direction DR1. Due to the characteristics of the shape and arrangement of the first row light emitting units UT11 and UT12, the second row light emitting units UT21 and UT22 may be substantially composed of light emitting parts formed by shifting the first row light emitting units UT11 and UT12 in the first direction DR1 and the second direction DR2. For example, the second row and first column light emitting units UT21 may be composed of light emitting parts having the same shape as light emitting parts of the first row and second column light emitting units UT12, and the second row and second column light emitting units UT22 may be composed of light emitting parts having the same shape as light emitting parts of the first row and first column light emitting units UT11.

Accordingly, the shape and arrangement of the connection lines CN-c disposed in the second row and first column light emitting units UT21 may be the same as that of the connection lines CN1b, CN2b, and CN3b disposed in the light emitting unit UT12 of the first row and second column. For example, the shape and arrangement of the connection lines CN-d disposed in the second row and second column light emitting units UT22 may be the same as that of the connection lines CN1a, CN2a, and CN3a disposed in the first row and first column light emitting unit UT11.

Referring to FIG. 6C, the first electrode EL1 (hereinafter referred to as an anode) of an emission element LD according to an embodiment may be commonly provided to light emitting parts EP1, EP2, and EP3. For example, the anode EL1 may be formed as a single layer over the entire display area DP-A, and accordingly, the anode EL1 layer may overlap the separator SPR. In another example, the anode EL1 of each of the emission elements LD may be formed as an independent conductive pattern spaced apart from each other, and may be connected (e.g., electrically connected) to each other through another conductive layer, and accordingly, the patterns of the anode EL1 may be disposed so as not to overlap the separator SPR.

As described above, a first power supply voltage VDD may be applied to the anode EL1 and a common voltage may be provided to all light emitting parts EP1, EP2, and EP3. The anode EL1 may be connected to a first power supply line VDL (see FIG. 2A) providing a first power supply voltage VDD in the peripheral area DP-NA (see FIG. 4A), or may be connected to the first power supply line VDL in the display area DP-A, but embodiments are not limited thereto.

For example, openings OP-EL1 may be defined/formed in the anode EL1 according to an embodiment, and the openings OP-EL1 may pass through the anode EL1 layer. The openings OP-EL1 of the anode EL1 layer may be disposed at a position that does not overlap the light emitting parts EP, and may generally be defined/formed at a position overlapping the separator SPR. The openings OP-EL1 may facilitate discharge of gas generated from an organic layer disposed below the anode EL1, for example, a sixth insulating layer 60 (see FIG. 7) described below. Accordingly, gas generated in the organic layer disposed below the emission element LD may be sufficiently discharged during the manufacturing process of the display panel, and gas discharged from the organic layer after manufacturing is reduced, and thus the rate at which the emission element LD is deteriorated may be reduced.

According to an embodiment, by including a connection line between the emission element and the pixel driver, in case that only the shape of the cathode is changed without changing the arrangement or shape of the light emitting parts, the emission element may be readily connected to the pixel driver. Accordingly, design freedom for the arrangement of the pixel driver may be improved, and the area or resolution of the light emitting part of the display panel may be readily increased.

Figure 7:
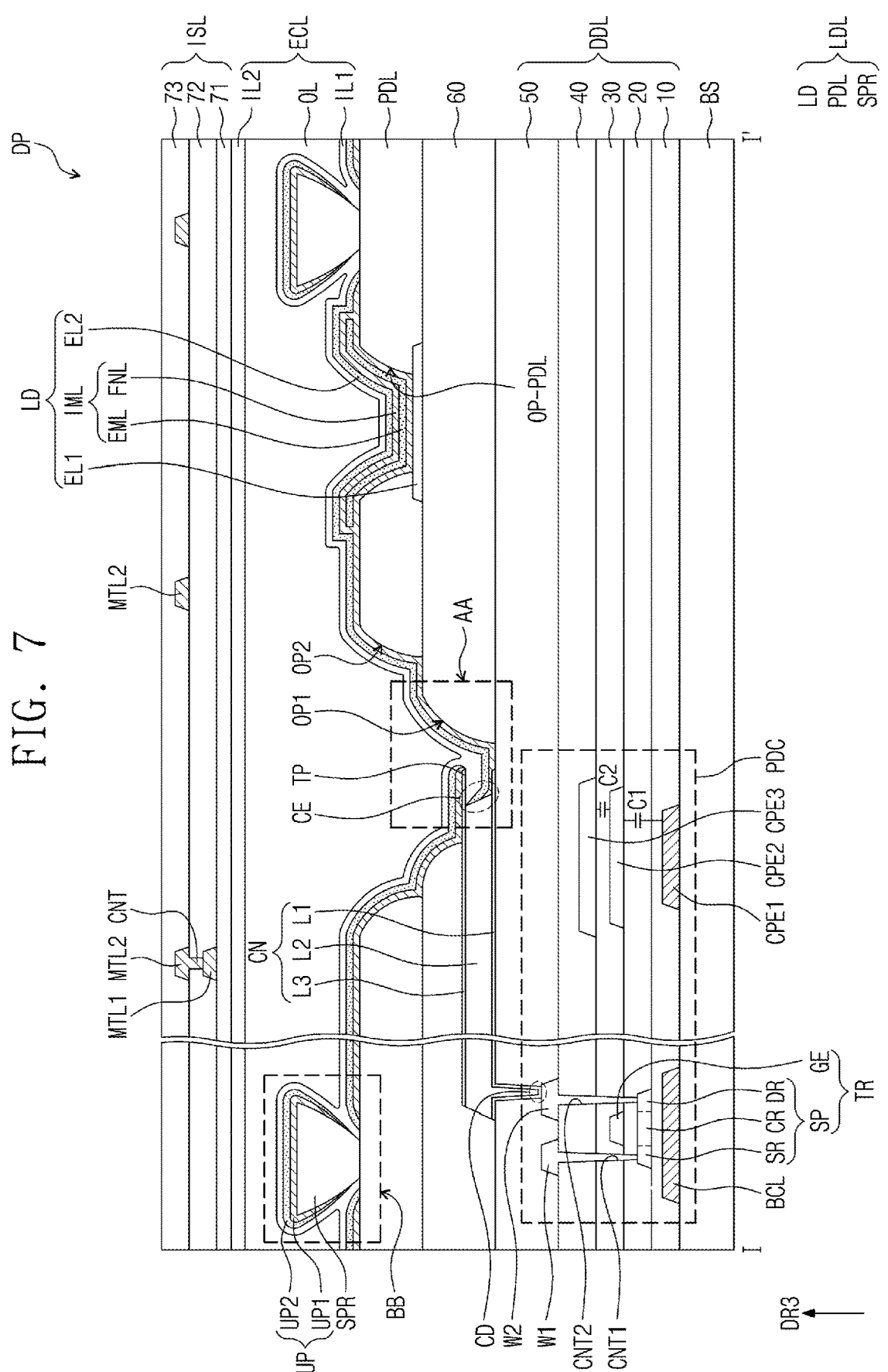
FIG. 7 is a schematic cross-sectional view of a display panel according to an embodiment.
Figure 8A:
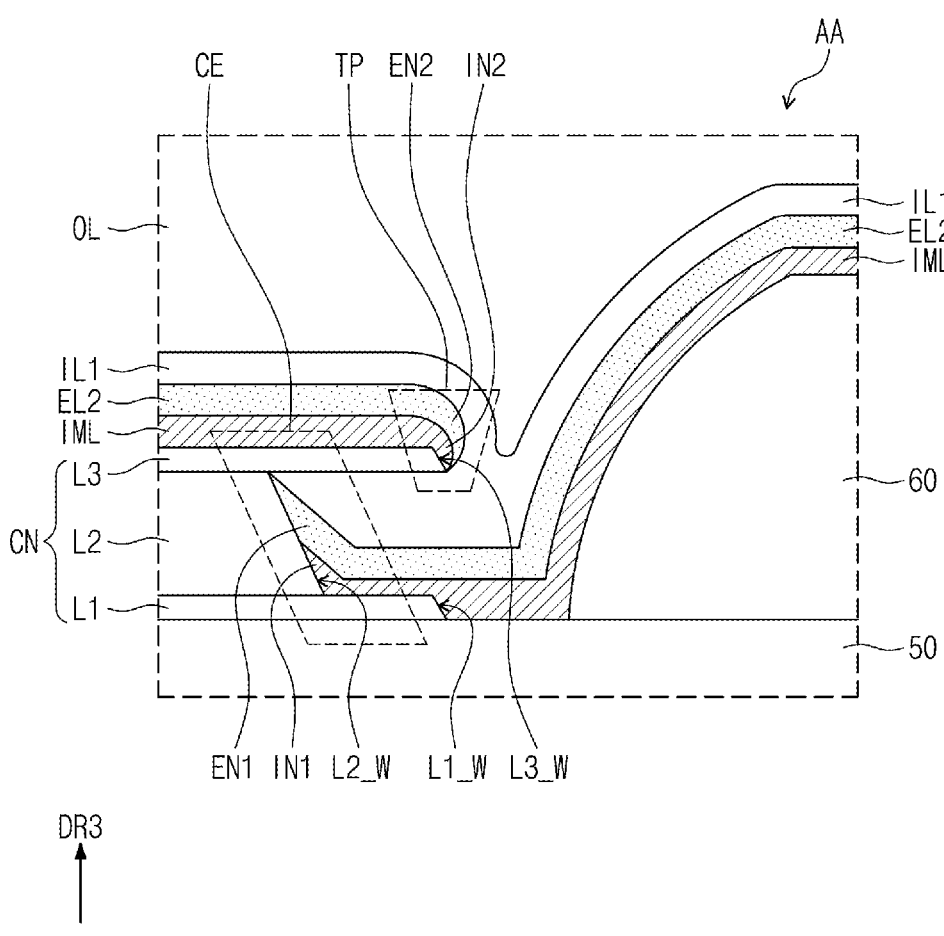
FIG. 8A is an enlarged schematic cross-sectional view of a partial area of a display panel according to an embodiment.
Figure 8B:
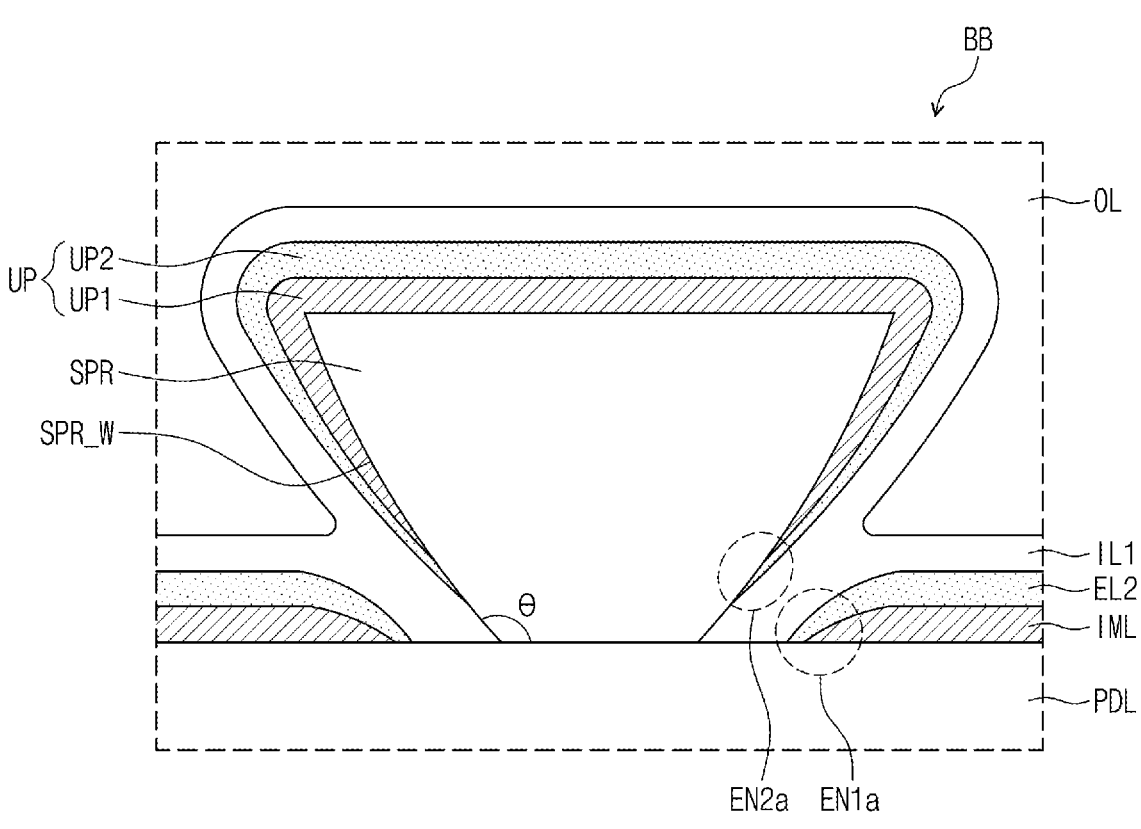
FIG. 8B is an enlarged schematic cross-sectional view of a partial area of a display panel according to an embodiment.
Figure 8B:

FIG. 7 is a schematic cross-sectional view of a display panel DP according to an embodiment. FIG. 8A is an enlarged schematic cross-sectional view of a partial area of a display panel DP according to an embodiment. FIG. 8B is an enlarged schematic cross-sectional view of a partial area of a display panel DP according to an embodiment. FIG. 7 is a schematic cross-sectional view showing a portion taken along line I-I' of FIG. 6B. FIG. 8A shows an enlarged schematic cross-sectional view of area AA of FIG. 7, and FIG. 8B shows an enlarged schematic cross-sectional view of area BB of FIG. 7. Hereinafter, embodiments will be described with reference to FIGS. 7 to 8B.

Referring to FIG. 7, a display panel DP according to an embodiment may include a base layer BS, a driving element layer DDL, an emission element layer LDL, an encapsulation layer ECL, and a detection layer ISL. The driving element layer DDL may include insulating layers 10, 20, 30, 40, and 50 disposed on the base layer BS, and conductive patterns and semiconductor patterns disposed between the insulating layers 10, 20, 30, 40, and 50. Conductive patterns and semiconductor patterns may be disposed between insulating layers 10, 20, 30, 40, and 50 to form a pixel driver PDC. FIG. 7 shows a cross-section of an area (e.g., single area) among areas where a light emitting part (e.g., single light emitting part) is disposed for descriptive convenience.

The base layer BS may be a member providing a base surface on which a pixel driver PDC is disposed. The base layer BS may be a rigid substrate or a flexible substrate that is bendable, foldable, rollable, or the like. The base layer BS may be a glass substrate, a metal substrate, or a polymer substrate. However, embodiments are not limited thereto, and the base layer BS may include an inorganic layer, an organic layer, or a composite material layer.

The base layer BS may have a multi-layered structure. The base layer BS may include a first polymer resin layer, a silicon oxide ($SiO_x$) layer disposed on the first polymer resin layer, an amorphous silicon (a-Si) layer disposed on the silicon oxide layer, and a second polymer resin layer disposed on the amorphous silicon layer. The silicon oxide layer and the amorphous silicon layer may be referred to as a base barrier layer.

The polymer resin layer may include a polyimide-based resin. For example, the polymer resin layer may include at least one of acryl-based resin, methacrylate-based resin, polyisoprene-based resin, vinyl-based resin, epoxy-based resin, urethane-based resin, cellulose-based resin, siloxane-based resin, polyamide-based resin, and perylene-based resin. In the description, "~~"-based resin means to include a functional group of "~~".

Each of the insulating layers, conductive layers, and semiconductor layers disposed on the base layer BS may be formed by a coating process or a deposition process. Through a plurality of photolithography processes, the insulating layer, the semiconductor layer, and the conductive layer may be selectively patterned to form holes in the insulating layer, or a semiconductor pattern, a conductive pattern, and a signal line may be formed.

The driving element layer DDL may include first to fifth insulating layers 10, 20, 30, 40, and 50 sequentially stacked on the base layer BS and a pixel driver PDC. FIG. 7 illustrates one transistor TR and two capacitors C1 and C2 of a pixel driver PDC. The transistor TR may correspond to the transistor connected to the emission element LD through the connection line CN, e.g., a connection transistor connected to a node corresponding to the cathode of the emission element LD (the fourth node N4 in FIG. 2A or the second node N2 in FIG. 2B), and may correspond to the sixth transistor T6 of FIG. 2A or the first transistor T1 of FIG. 2B. For example, other transistors forming the pixel driver PDC may have the same structure as the transistor TR (hereinafter referred to as a connection transistor) shown in FIG. 7. However, this is described as an example, and other transistors forming the pixel driver PDC may have structures different from those of the connection transistor TR, but embodiments are not limited thereto.

The first insulating layer 10 may be disposed on the base layer BS. The first insulating layer 10 may be an inorganic layer and/or an organic layer, and may have a single layer structure or a multilayer structure. The first insulating layer 10 may include at least one of aluminum oxide, titanium oxide, silicon oxide, silicon nitride, silicon oxynitride, zirconium oxide, and hafnium oxide. In an embodiment, the first insulating layer 10 is shown as a single-layer silicon oxide layer. For example, other insulating layers as described below may be inorganic layers and/or organic layers, and may have a single-layer structure or a multi-layer structure. The inorganic layer may include at least one of the above-mentioned materials, but embodiments are not limited thereto.

For example, the first insulating layer 10 may cover the lower conductive layer BCL. For example, the display panel DP may further include a lower conductive layer BCL disposed to overlap the connection transistor TR. The lower conductive layer BCL may block an electric potential due to a polarization phenomenon of the base layer BS from affecting the connection transistor TR. For example, the lower conductive layer BCL may block light incident from the lower side to the connection transistor TR. At least one of an inorganic barrier layer and a buffer layer may be further disposed between the lower conductive layer BCL and the base layer BS.

The lower conductive layer BCL may include a reflective metal. For example, the lower conductive layer BCL may include titanium (Ti), molybdenum (Mo), an alloy containing Mo, aluminum (Al), an alloy containing Al, aluminum nitride ($Al_xN_y$), tungsten (W), tungsten nitride ($W_xN_y$), and/or copper (Cu).

In an embodiment, the lower conductive layer BCL may be connected to other conductive pattern, such as the source electrode of the connection transistor TR, the gate electrode of the connection transistor TR, or etc. For example, the lower conductive layer BCL may be electrically connected to the source electrode of the connection transistor TR through the source electrode pattern W1. Or, for example, the lower conductive layer BCL may be connected to and synchronized with the gate electrode of the connection transistor TR. In another example, the lower conductive layer BCL may be connected to another electrode to independently receive a constant voltage or pulse signal. In another example, the lower conductive layer BCL may be provided in an isolated form from other conductive patterns. The lower conductive layer BCL according to an embodiment may be provided in various forms but embodiments are not limited thereto.

A connection transistor TR may be disposed on the first insulating layer 10. The connection transistor TR may include a semiconductor pattern SP and a gate electrode GE. The semiconductor pattern SP may be disposed on the first insulating layer 10. The semiconductor pattern SP may include an oxide semiconductor. For example, the oxide semiconductor may include transparent conductive oxide (TCO), such as indium tin oxide (ITO), indium zinc oxide (IZO), indium gallium zinc oxide (IGZO), zinc oxide (ZnO) or indium oxide ($In_2O_3$). However, embodiments are not limited thereto, and the semiconductor pattern SP may include amorphous silicon, low-temperature polycrystalline silicon, or polycrystalline silicon.

The semiconductor pattern SP may include a source region SR, a drain region DR, and a channel region CR classified according to conductivity. The channel region CR may be a portion overlapping the gate electrode GE in a plan view. The source region SR and the drain region DR may be spaced apart with a channel region CR therebetween. In case that the semiconductor pattern SP is an oxide semiconductor, each of the source region SR and the drain region DR may be a reduced region. Accordingly, the source region SR and the drain region DR have a relatively high reducing metal content as compared to the channel region CR. In another example, in case that the semiconductor pattern SP is polycrystalline silicon, each of the source region SR and the drain region DR may be a region doped with a high concentration.

The source region SR and the drain region DR may have relatively higher conductivity than the channel region CR. The source region SR may correspond to the source electrode of the connection transistor TR, and the drain region DR may correspond to the drain electrode of the connection transistor TR. As shown in FIG. 7, separate source electrode patterns W1 and drain electrode patterns W2 respectively connected to the source region SR and the drain region DR may be further provided. For example, the separate source electrode pattern W1 and drain electrode pattern W2 may be integrally formed with one of the lines forming the pixel drivers PDC and PDC–1 (see FIGS. 2A and 2B), respectively, and embodiments are not limited thereto.

The second insulating layer 20 may overlap pixels in common and may cover the semiconductor pattern SP. The second insulating layer 20 may be an inorganic layer and/or an organic layer, and may have a single layer structure or a multilayer structure. The second insulating layer 20 may include at least one of aluminum oxide, titanium oxide, silicon oxide, silicon nitride, silicon oxynitride, zirconium oxide, and hafnium oxide. In an embodiment, the second insulating layer 20 may be a single-layer silicon oxide layer.

The gate electrode GE may be disposed on the second insulating layer 20. The gate electrode GE may correspond to the gate electrode of the connection transistor TR. For example, the gate electrode GE may be disposed above the semiconductor pattern SP. However, this is illustrated as an example, and the gate electrode GE may be disposed below the semiconductor pattern SP, but embodiments are not limited thereto.

The gate electrode GE may include titanium (Ti), silver (Ag), molybdenum (Mo), aluminum (Al), aluminum nitride ($Al_xN_y$), tungsten (W), tungsten nitride ($W_xN_y$), copper (Cu), or alloys thereof, but embodiments are not limited thereto.

A third insulating layer 30 may be disposed on the gate electrode GE. The third insulating layer 30 may be an inorganic layer and/or an organic layer, and may have a single layer structure or a multilayer structure. The fourth insulating layer 40 may include at least one of aluminum oxide, titanium oxide, silicon oxide, silicon nitride, silicon oxynitride, zirconium oxide, and hafnium oxide.

Among the conductive patterns W1, W2, CPE1, CPE2, and CPE3, the first capacitor electrode CPE1 and the second capacitor electrode CPE2 may form the first capacitor C1. The first capacitor electrode CPE1 and the second capacitor electrode CPE2 may be spaced apart with the first insulating layer 10 and the second insulating layer 20 therebetween.

In an embodiment, the first capacitor electrode CPE1 and the lower conductive layer BCL may have an integral shape. For example, the second capacitor electrode CPE2 and the gate electrode GE may have an integral shape.

A third capacitor electrode CPE3 may be disposed on the third insulating layer 30. The third capacitor electrode CPE3 may be spaced apart from the second capacitor electrode CPE2 with the third insulating layer 30 therebetween, and the second capacitor electrode CPE2 and the third capacitor electrode CPE3 may overlap in a plan view. The second capacitor electrode CPE2 and the third capacitor electrode CPE3 may form the second capacitor C2.

A fourth insulating layer 40 may be disposed on the third insulating layer 30 and the third capacitor electrode CPE3. The fourth insulating layer 40 may be an inorganic layer and/or an organic layer, and may have a single layer structure or a multilayer structure. The fourth insulating layer 40 may include at least one of aluminum oxide, titanium oxide, silicon oxide, silicon nitride, silicon oxynitride, zirconium oxide, and hafnium oxide.

A source electrode pattern W1 and a drain electrode pattern W2 may be disposed on the fourth insulating layer 40. The source electrode pattern W1 may be connected to the source region SR of the connection transistor TR through the first contact hole CNT1, and the source electrode pattern W1 and the source region SR of the semiconductor pattern SP may function as a source electrode of the connection transistor TR. The drain electrode pattern W2 may be connected to the drain region DR of the connection transistor TR through the second contact hole CNT2, and the drain electrode pattern W2 and the drain region DR of the semiconductor pattern SP may function as a drain electrode of the connection transistor TR. A fifth insulating layer 50 may be disposed on the source electrode pattern W1 and the drain electrode pattern W2.

A connection line CN may be disposed on the fifth insulating layer 50. The connection line CN may connect (e.g., electrically connect) the pixel driver PDC and the emission element LD. For example, the connection line CN may connect (e.g., electrically connect) the connection transistor TR and the emission element LD. The connection line CN may be a connection node connecting the pixel driver PDC and the emission element LD. For example, the connection line CN may correspond to the fourth node N4 (see FIG. 2A) shown in FIG. 2A or the second node N2 (see FIG. 2B) shown in FIG. 2B. This is illustratively described, in case that the connection line CN is connected to the emission element LD, it may be defined as a connection node connected with various elements among elements forming the pixel driver PDC according to the design of the pixel driver PDC, but embodiments are not limited thereto.

A sixth insulating layer 60 may be disposed on the connection line CN. The sixth insulating layer 60 may be disposed on the fifth insulating layer 50 to cover the connection line CN. Each of the fifth insulating layer 50 and the sixth insulating layer 60 may be an organic layer. For example, each of the fifth insulating layer 50 and the sixth insulating layer 60 may include general purpose polymers such as Benzocyclobutene (BCB), polyimide, Hexamethyldisiloxane (HMDSO), Polymethylmethacrylate (PMMA), or polystyrene (PS), polymer derivatives having phenol-based groups, acryl-based polymers, imide-based polymers, arylether-based polymers, amide-based polymers, fluorine-based polymers, p-xylene-based polymers, vinyl alcohol-based polymers, blends thereof, and/or the like.

An opening exposing at least a portion of the connection line CN may be provided in the sixth insulating layer 60. The connection line CN may be connected (e.g., electrically connected) to the emission element LD through a portion exposed from the sixth insulating layer 60. For example, the connection line CN may connect (e.g., electrically connect)

the connection transistor TR and the emission element LD. A detailed description of this will be given below. For example, in the display panel DP according to an embodiment, the sixth insulating layer 60 may be omitted or provided in plural, but embodiments are not limited thereto.

An emission element layer LDL may be disposed on the sixth insulating layer 60. The emission element layer LDL may include a pixel defining film PDL, an emission element LD, and a separator SPR. The pixel defining film PDL may be an organic layer. For example, the pixel defining film PDL may include general purpose polymers such as Benzocyclobutene (BCB), polyimide, Hexamethyldisiloxane (HMDSO), Polymethylmethacrylate (PMMA), or polystyrene (PS), polymer derivatives having phenol-based groups, acryl-based polymers, imide-based polymers, arylether-based polymers, amide-based polymers, fluorine-based polymers, p-xylene-based polymers, vinyl alcohol-based polymers, blends thereof, and/or the like.

In an embodiment, the pixel defining film PDL may have a property of absorbing light and may have, for example, a black color. For example, the pixel defining film PDL may include a black coloring agent. The black coloring agent may include a black dye and a black pigment. The black coloring agent may include carbon black, a metal such as chromium, or an oxide thereof. The pixel defining film PDL may correspond to a light blocking pattern having light blocking characteristics.

An opening OP-PDL (hereinafter referred to as a light emitting opening) exposing at least a portion of the first electrode EL1 as described below may be defined in the pixel defining film PDL. Light emitting openings OP-PDL may be provided and disposed to correspond to emission elements LD, respectively. In the light emitting opening OP-PDL, all components of the emission element LD may be overlapped and disposed, and the light emitting opening OP-PDL may be an area in which light emitted by the emission element LD is substantially emitted. Accordingly, the shape of the light emitting part EP (see FIG. 6) may substantially correspond to the shape of the light emitting opening OP-PDL in a plan view.

The emission element LD may include a first electrode EL1, an intermediate layer IML, and a second electrode EL2. The first electrode EL1 may be a semi-transmissive, transmissive, or reflective electrode. According to an embodiment, the first electrode EL1 may include a reflective layer formed of silver (Ag), magnesium (Mg), aluminum (Al), platinum (Pt), palladium (Pd), gold (Au), nickel (Ni), neodymium (Nd), iridium (Ir), chromium (Cr)), or a compound thereof, and a transparent or semi-transparent electrode layer formed on the reflective layer. The transparent or semi-transparent electrode layer may include at least one selected from the group consisting of indium tin oxide (ITO), indium zinc oxide (IZO), indium gallium zinc oxide (IGZO), zinc oxide (ZnO), indium oxide ($In_2O_3$), and aluminum doped zinc oxide (AZO). For example, the first electrode EL1 may include a stacked structure of ITO/Ag/ITO.

In an embodiment, the first electrode EL1 may be an anode of the emission element LD. For example, the first electrode EL1 may be connected to a first power supply line VDL (see FIG. 2A) and a first power supply voltage VDD (see FIG. 2A) may be applied. The first electrode EL1 may be connected to the first power supply line VDL in the display area DP-A (see FIG. 4A) or connected to the first power supply line VDL in the peripheral area DP-NA (see FIG. 4A). In the latter case, the first power supply line VDL may be disposed in the peripheral area DP-NA, and the first electrode EL1 may have a shape extending to the peripheral area DP-NA.

In the cross-sectional view of FIG. 7, the first electrode EL1 may overlap the light emitting opening OP-PDL and may not overlap the separator SPR, but as described above with reference to FIG. 6C, the first electrodes EL1 of each emission element LD may have an integral shape and may have a mesh or lattice shape in which openings are defined in some areas. For example, in case that the same first power supply voltage VDD is applied to the first electrode EL1 of each of the emission elements LD, the shape of the first electrode EL1 may be provided in various ways, but embodiments are not limited thereto.

The intermediate layer IML may be disposed between the first electrode EL1 and the second electrode EL2. The intermediate layer IML may include an emission layer EML and a functional layer FNL. The emission element LD may include an intermediate layer IML of various structures, but embodiments are not limited thereto. For example, the functional layer FNL may be formed as a plurality of layers or as two or more layers spaced apart with an emission layer EML therebetween. In another example, the functional layer FNL may be omitted.

The emission layer EML may include an organic light emitting material. For example, the emission layer EML may include an inorganic light emitting material or may be formed as a mixed layer of an organic light emitting material and an inorganic light emitting material. In an embodiment, the emission layers EML included in each of adjacent light emitting parts EP (see FIG. 6C) may include light emitting materials displaying different colors. For example, an emission layer EML included in each light emitting part EP may provide any one of blue light, red light, and green light. However, embodiments are not limited thereto, and the emission layers EML disposed in all light emitting parts EP may include a light emitting material emitting the same color light. For example, the emission layer EML may emit blue light or white light. For example, in FIG. 7, the emission layer EML and the functional layer FNL are illustrated as an embodiment in different shapes, but embodiments are not limited thereto and the emission layer EML and the functional layer FNL may be disposed in the same shape in a plan view.

The functional layer FNL may be disposed between the first electrode EL1 and the second electrode EL2. For example, the functional layer FNL may be disposed between the first electrode EL1 and the emission layer EML or between the second electrode EL2 and the emission layer EML. In another example, the functional layer FNL may be disposed between the first electrode EL1 and the emission layer EML and between the second electrode EL2 and the emission layer EML. In an embodiment, the emission layer EML is shown as being inserted into the functional layer FNL. However, this is shown as an example, and the functional layer FNL may include a layer disposed between the emission layer EML and the first electrode EL1 and/or a layer disposed between the emission layer EML and the second electrode EL2, and the functional layer FNL may be provided in plural, but embodiments are not limited thereto.

The functional layer FNL may control the movement of charges between the first electrode EL1 and the second electrode EL2. The functional layer FNL may include a hole injection/transport material and/or an electron injection/transport material. The functional layer FNL may include at least one of an electron blocking layer, a hole transporting layer, a hole injection layer, a hole blocking layer, an electron transporting layer, an electron injection layer, and a charge generating layer.

The second electrode EL2 may be disposed on the intermediate layer IML. As described above, the second electrode EL2 may be connected to the connection line CN and connected (e.g., electrically connected) to the pixel driver PDC. For example, the second electrode EL2 may be connected (e.g., electrically connected) to the connection transistor TR through the connection line CN.

As described above, the connection line CN may include a driver connection part CD and an emission connection part CE. The driver connection part CD may be a part of the connection line CN connected to the pixel driver PDC and substantially connected to the connection transistor TR. In an embodiment, the driver connection part CD may penetrate the fifth insulating layer 50 and may be connected (e.g., electrically connected) to the drain region DR of the semiconductor pattern SP through the drain electrode pattern W2. The emission connection part CE may be a part of the connection line CN connected to the emission element LD. The emission connection part CE may be defined in a region exposed from the sixth insulating layer 60 and may be a portion to which the second electrode EL2 is connected. For example, a tip portion TP may be defined in the emission connection part CE.

The emission connection part CE of the connection line CN will be described with reference to FIGS. 7 and 8A. As shown in FIGS. 7 and 8A, the connection line CN may have a three-layer structure. For example, the connection line CN may include a first layer L1, a second layer L2, and a third layer L3 sequentially stacked along the third direction DR3. The second layer L2 may include a material different from that of the first layer L1. For example, the second layer L2 may include a material different from that of the third layer L3. The second layer L2 may have a relatively thick thickness as compared to the first layer L1. For example, the second layer L2 may have a relatively thick thickness as compared to the third layer L3. The second layer L2 may include a highly conductive material. In an embodiment, the second layer L2 may include aluminum (Al).

For example, the first layer L1 may include a material having a lower etch rate than the second layer L2. For example, the second layer L2 may be composed of materials having a high etching selectivity to the first layer L1. In an embodiment, the first layer L1 may include titanium (Ti), and the second layer L2 may include aluminum (Al). For example, the side surface L1_W of the first layer L1 may be defined outside the side surface L2_W of the second layer L2. For example, the emission connection part CE of the connection line CN may have a shape in which the side surface L1_W of the first layer L1 protrudes outward from the side surface L2_W of the second layer L2. For example, the emission connection part CE of the connection line CN may have a shape in which the side surface L2_W of the second layer L2 is depressed inward from the side surface L1_W of the first layer L1.

For example, the third layer L3 may include a material having a lower etch rate than the second layer L2. For example, the second layer L2 may be composed of materials having a high etching selectivity to the third layer L3. In an embodiment, the third layer L3 may include titanium (Ti), and the second layer L2 may include aluminum (Al). For example, the side surface L3_W of the third layer L3 may be defined outside the side surface L2_W of the second layer L2. For example, the emission connection part CE of the connection line CN may have a shape in which the side surface L3_W of the third layer L3 protrudes outward from the side surface L2_W of the second layer L2. For example, the emission connection part CE of the connection line CN may have an undercut shape or an overhang structure, and the tip portion TP of the emission connection part CE may be defined by a protruding portion of the third layer L3 as compared to the second layer L2.

The sixth insulating layer 60 and the pixel defining film PDL may expose at least a portion of the tip portion TP and at least a portion of the side surface L2_W of the second layer L2. For example, a first opening OP1 exposing an end of the connection line CN may be defined in the sixth insulating layer 60, and a second opening OP2 overlapping the first opening OP1 may be defined in the pixel defining film PDL. A planar area/size of the second opening OP2 may be larger than that of the first opening OP1. However, embodiments are not limited thereto, and in case that at least a portion of the tip portion TP and at least a portion of the side surface L2_W of the second layer L2 are exposed, the planar area/size of the second opening OP2 may be smaller than or equal to that of the first opening OP1.

An intermediate layer IML may be disposed on the pixel defining film PDL. The intermediate layer IML may be disposed on a portion of the sixth insulating layer 60 exposed by the second opening OP2 of the pixel defining film PDL. For example, the intermediate layer IML may be disposed on a portion of the connection line CN exposed by the first opening OP1 of the sixth insulating layer 60. As shown in FIG. 8A, the intermediate layer IML may include an end portion IN1 disposed along the upper surface of the fifth insulating layer 50 and another end portion IN2 disposed along the upper surface of the tip portion TP. For example, when viewed in a cross-sectional view, the intermediate layer IML may have a shape in which the emission connection part CE is partially disconnected with respect to the tip portion TP as a reference. However, when viewed in a plan view, the intermediate layer IML may have an integral shape connected as a whole within a region (see FIG. 6A) defined as a closed line by a separator.

For example, an end portion EN1 of the second electrode EL2 may be disposed along the side surface L2_W of the second layer L2 to contact the side surface L2_W of the second layer L2. For example, through the difference in the deposition angle of the second electrode EL2 and the intermediate layer IML, the second electrode EL2 may contact the side surface L2_W of the second layer L2 exposed from the intermediate layer IML by the tip portion TP. For example, the intermediate layer IML may be spaced apart from the side surface L2_W of the second layer L2. For example, the second electrode EL2 may be connected to the connection line CN without a separate patterning process for the intermediate layer IML, and accordingly, the emission element LD may be connected (e.g., electrically connected) to the pixel driver PDC through the connection line CN.

In an embodiment, although another end portion IN2 of the intermediate layer IML and another end portion EN2 of the second electrode EL2 are shown as covering the side surface L3_W of the third layer L3, this is illustrated as an example, and at least a portion of the side surface L3_W of the third layer L3 may be exposed from another end portion IN2 of the intermediate layer IML and/or another end portion EN2 of the second electrode EL2.

As described above, the display panel DP may include the separator SPR. The separator SPR may be disposed on the pixel defining film PDL. In an embodiment, the second electrode EL2 and the intermediate layer IML may be formed by depositing pixels in common through an open mask. For example, the second electrode EL2 and the intermediate layer IML may be divided by the separator SPR. As described above, the separator SPR may have a closed line shape for each light emitting part EP, and thus the second electrode EL2 and the intermediate layer IML may have a divided shape for each light emitting part EP. For example, the second electrode EL2 and the intermediate layer IML may be electrically independent of those of adjacent pixels.

The separator SPR will be described with reference to FIGS. 7 and 8B. As shown in FIG. 8B, the separator SPR may have a reverse tapered shape. For example, an angle θ (e.g., taper angle below) formed by the side surface SPR_W of the separator SPR with respect to the upper surface of the pixel defining film PDL may be an obtuse angle. However, this is shown as an example, and in case that the separator SPR electrically disconnects the second electrode EL2 for each pixel, the taper angle θ may be set in various ways. For example, the separator SPR may have the same structure as the tip portion TP, but embodiments are limited thereto.

In an embodiment, the separator SPR may include an insulating material, and may include an organic insulating material. The separator SPR may include an inorganic insulating material, may include a multi-layer structure of an organic insulating material and an inorganic insulating material, or may include a conductive material according to embodiments. For example, as long as the second electrode EL2 is electrically disconnected for each pixel, the type of material of the separator SPR is not limited.

A dummy layer UP may be disposed on the separator SPR. The dummy layer UP may include a first dummy layer UP1 disposed on the separator SPR and a second dummy layer UP2 disposed on the first dummy layer UP1. The first dummy layer UP1 may be formed through the same process as the intermediate layer IML and may include the same material as each other. The second dummy layer UP2 may be formed through the same process as the second electrode EL2 and may include the same material. For example, the first dummy layer UP1 and the second dummy layer UP2 may be formed simultaneously during the formation of the intermediate layer IML and the second electrode EL2. In another example, the display panel DP may not include the dummy layer UP.

As shown in FIG. 8B, in an embodiment, the second electrode EL2 may include a first end portion EN1a, and the second dummy layer UP2 may include a second end portion EN2a. The first end portion EN1a may be spaced apart from the separator SPR and positioned on a pixel defining film PDL, and the second end portion EN2a may be separated from the first end portion EN1a and positioned on the side surface SPR_W of the separator SPR. However, although the first end portion EN1a is shown to be spaced apart from the side surface SPR_W of the separator SPR by a certain distance in FIG. 8B, embodiments are not limited thereto, and in case that the second end portion EN2a is electrically disconnected, the first end portion EN1a may contact the side surface SPR_W of the separator SPR. For example, in case that the first end portion EN1a and the second end portion EN2a are connected without being distinguished from each other, in case that the thickness of the portion formed along the side surface SPR_W of the separator SPR is thin and the electrical resistance is high, in case that the second electrode EL2 is electrically disconnected between adjacent pixels, the second electrode EL2 may be divided by the separator SPR.

According to an embodiment, in case that there is no separate patterning process for the second electrode EL2 or the intermediate layer IML, by not forming the second electrode EL2 or the intermediate layer IML on the side surface SPR_W of the separator SPR or by forming it thinly on the side surface SPR_W of the separator SPR, the second electrode EL2 or the intermediate layer IML may be divided for each pixel. For example, in case that the second electrode EL2 or the intermediate layer IML is electrically disconnected between adjacent pixels, the shape of the separator SPR may be variously modified, but embodiments are not limited thereto.

Referring back to FIG. 7, an encapsulation layer ECL may be disposed on the emission element layer LDL. The encapsulation layer ECL may cover the emission element LD and may cover the separator SPR. The encapsulation layer ECL may include a first inorganic layer IL1, an organic layer OL, and a second inorganic layer IL2 sequentially stacked. However, embodiments are not limited thereto, and the encapsulation layer ECL may further include inorganic layers and organic layers. For example, the encapsulation layer ECL may be a glass substrate.

The first and second inorganic layers IL1 and IL2 may protect the emission element LD from moisture and oxygen outside the display panel DP, and the organic layer OL may protect the emission element LD from foreign substances such as particles remaining during the formation of the first inorganic layer IL1. The first and second inorganic layers IL1 and IL2 may include a silicon nitride layer, a silicon oxynitride layer, a silicon oxide layer, a titanium oxide layer, an aluminum oxide layer, or the like. The organic layer OL may include an acryl-based organic layer, and the type of material is not limited thereto.

The detection layer ISL may detect external input. In an embodiment, the detection layer ISL may be formed on the encapsulation layer ECL through a continuous process. For example, it may be said that the detection layer ISL is directly disposed on the encapsulation layer ECL. "Being directly disposed/placed" may mean that no other components are disposed/placed between the detection layer ISL and the encapsulation layer ECL. For example, a separate adhesive member may not be disposed between the detection layer ISL and the encapsulation layer ECL. However, this is shown as an example, and in the display panel DP according to an embodiment, the detection layer ISL may be separately formed and coupled to the display panel DP through an adhesive member, but embodiments are not limited thereto.

The detection layer ISL may include conductive layers and insulating layers. The conductive layers may include a first detection conductive layer MTL1 and a second detection conductive layer MTL2, and the insulating layers may include the first to third detection insulating layers 71, 72, and 73. However, this is shown as an example, and the number of conductive layers and insulating layers is not limited to any one embodiment.

Each of the first to third detection insulating layers 71, 72, and 73 may have a single-layer structure or a multi-layer structure stacked along the third direction DR3. The first to third detection insulating layers 71, 72, and 73 may include an inorganic film. The inorganic film may include at least one of aluminum oxide, titanium oxide, silicon oxide, silicon nitride, silicon oxynitride, zirconium oxide, and hafnium oxide. The first to third detection insulating layers 71, 72, and 73 may include an organic film. The organic film may include at least one of acryl-based resin, methacryl-based resin, polyisoprene-based resin, vinyl-based resin, epoxy-based resin, urethane-based resin, cellulose-based resin, siloxane-based resin, polyimide-based resin, polyamide-based resin, and perylene-based resin.

A first detection conductive layer MTL1 may be disposed between the first detection insulating layer 71 and the second detection insulating layer 72, and the second detection conductive layer MTL2 may be disposed between the second detection insulating layer 72 and the third detection insulating layer 73. A part of the second detection conductive layer MTL2 may be connected to the first detection conductive layer MTL1 through a contact hole CNT formed in the second detection insulating layer 72. Each of the first detection conductive layer MTL1 and the second detection conductive layer MTL2 may have a single-layer structure or a multi-layer structure stacked along the third direction DR3.

The single-layer detection conductive layer may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO), indium zinc tin oxide (IZTO), and the like. In another example, the transparent conductive layer may include a conductive polymer such as poly(3,4-ethylenedioxythiophene) (PEDOT), metal nanowires, graphene, and the like.

The detection conductive layer of the multilayer structure may include metal layers. The metal layers may have, for example, a three-layer structure of titanium (Ti)/aluminum (Al)/titanium (Ti). In another example, the detection conductive layer of the multilayer structure may include at least one metal layer and at least one transparent conductive layer.

The first detection conductive layer MTL1 and the second detection conductive layer MTL2 may form a sensor for detecting an external input in the detection layer ISL. The sensor may be driven by a capacitance method, and may be driven by any one of a mutual-capacitance method and a self-capacitance method. However, this is described as an example, and the sensor may be driven by a resistive film method, an ultrasonic method, or an infrared method in addition to the capacitive method, but embodiments are not limited thereto.

Each of the first detection conductive layer MTL1 and the second detection conductive layer MTL2 may include a transparent conductive oxide or may have a metal mesh shape formed of an opaque conductive material. The first detection conductive layer MTL1 and the second detection conductive layer MTL2 may have various materials and various shapes as long as the visibility of the image displayed by the display panel DP may not be deteriorated, but embodiments are not limited thereto.

Figure 9A:
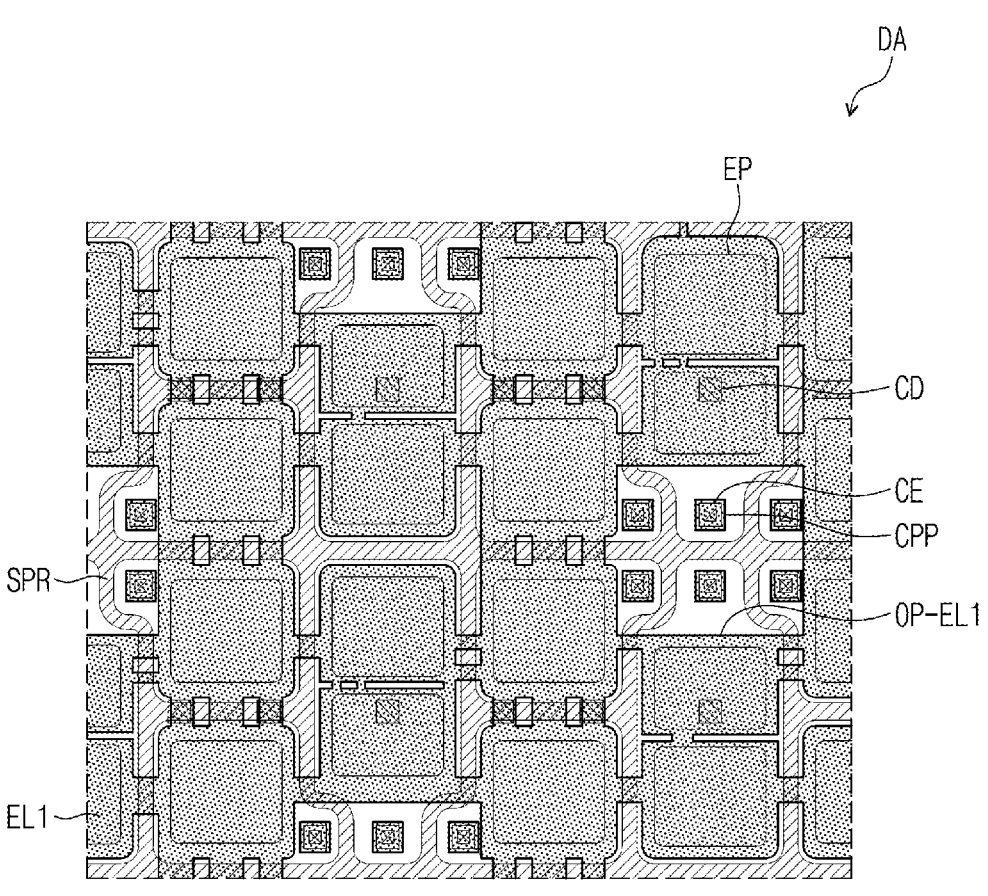
FIG. 9A is a schematic plan view of a display panel according to an embodiment.
Figure 9B:
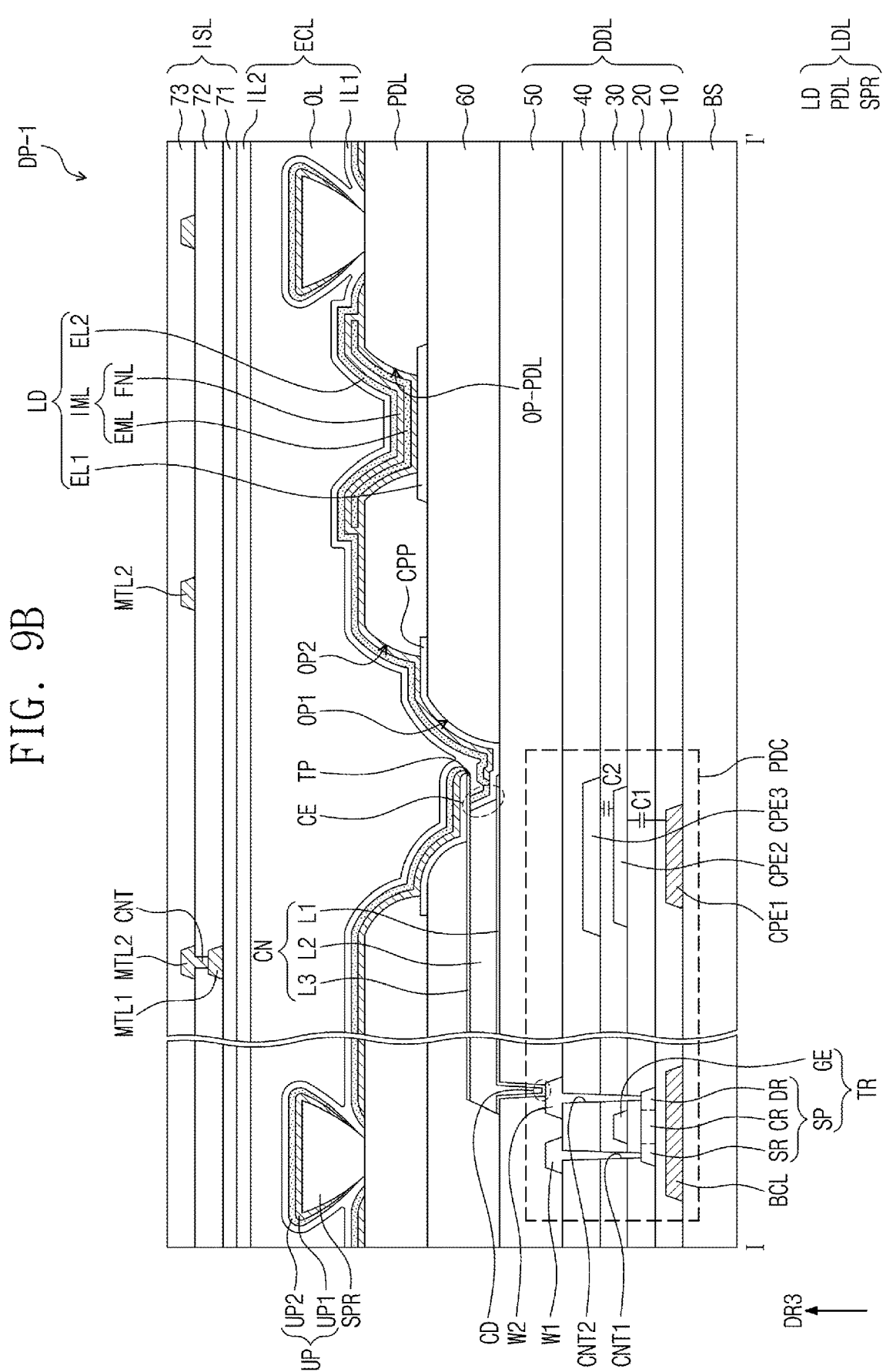
FIG. 9B is a schematic cross-sectional view of a display panel according to an embodiment.

FIG. 9A is a schematic plan view of a display panel according to an embodiment. FIG. 9B is a schematic cross-sectional view of a display panel according to an embodiment. FIG. 9A shows a schematic view of the display panel DP-1 corresponding to FIG. 6C, and FIG. 9B shows an area of the display panel DP-1 corresponding to FIG. 7. Hereinafter, embodiments will be described with reference to FIGS. 9A and 9B. The same reference numerals are assigned to the same configurations as those described with reference to FIGS. 1 to 8B, and redundant descriptions will be omitted for descriptive convenience.

As shown in FIGS. 9A and 9B, the display panel DP-1 may further include a capping pattern CPP as compared to the display panel DP shown in FIG. 7. The capping pattern CPP may be disposed on the sixth insulating layer 60. For example, the capping pattern CPP may be disposed on a portion of the connection line CN exposed by the first opening OP1 of the sixth insulating layer 60. The capping pattern CPP may overlap the connection line CN, and may overlap the emission connection part CE and/or the tip portion TP.

The capping pattern CPP may have a shape in which the connection is partially disconnected based on the tip portion TP in the area where the emission connection part CE is defined, and when viewed in a plan view, the capping pattern CPP may have an integral shape connected as a whole within a region (see FIG. 6A) defined as a closed line by the separator SPR. For example, the capping pattern CPP may have an integral shape, but may include a portion disconnected at the emission connection part CE. For example, an end portion of the partially disconnected capping pattern CPP may contact the side surface of the second layer L2 of the connection line CN, and another end portion of the capping pattern CPP may be disposed on the third layer L3 of the connection line CN to cover the tip portion TP.

The capping pattern CPP may include a conductive material. Accordingly, the second electrode EL2 may be connected (e.g., electrically connected) to the connection line CN through the capping pattern CPP. For example, the capping pattern CPP may contact the side surface of the second layer L2 of the connection line CN and the second electrode EL2 may contact the capping pattern CPP to connect (e.g., electrically connect) all of them. The capping pattern CPP may be disposed relatively outside the second layer L2 of the connection line CN, and the second electrode EL2 may be connected (e.g., electrically connected) to the second layer L2 only by being connected to the capping pattern CPP instead of the side surface of the second layer L2, so that a connection between the connection line CN and the second electrode EL2 may be more readily made.

For example, the capping pattern CPP may include a material having a relatively low reactivity as compared to the second layer L2 of the connection line CN. For example, the capping pattern CPP may include copper (Cu), silver (Ag), a transparent conductive oxide, or the like. As the side surface of the second layer L2 of the connection line CN is protected by the capping pattern CPP having relatively low reactivity, oxidation of a material included in the second layer L2 may be prevented. For example, during the etching process of patterning the first electrode EL1, the silver (Ag) component included in the first electrode EL1 layer may be reduced and remaining as particles causing defects may be prevented.

In an embodiment, the capping pattern CPP and the first electrode EL1 may be formed through the same process, and may include the same material. For example, as shown in FIG. 9A, the capping pattern CPP and the first electrode EL1 may be disposed on the same layer (e.g., sixth insulating layer 60) and formed of the same material. Capping patterns CPP may be provided, disposed on the corresponding emission connection part CE, and spaced apart from the integrally shaped first electrode EL1 in a plan view to be electrically separated from the first electrode EL1. However, this is illustratively described, and the capping pattern CPP may be formed through a process different from that of the first electrode EL1 or may include a material different that of the first electrode EL1, but embodiments are not limited thereto.

Figure 10A:
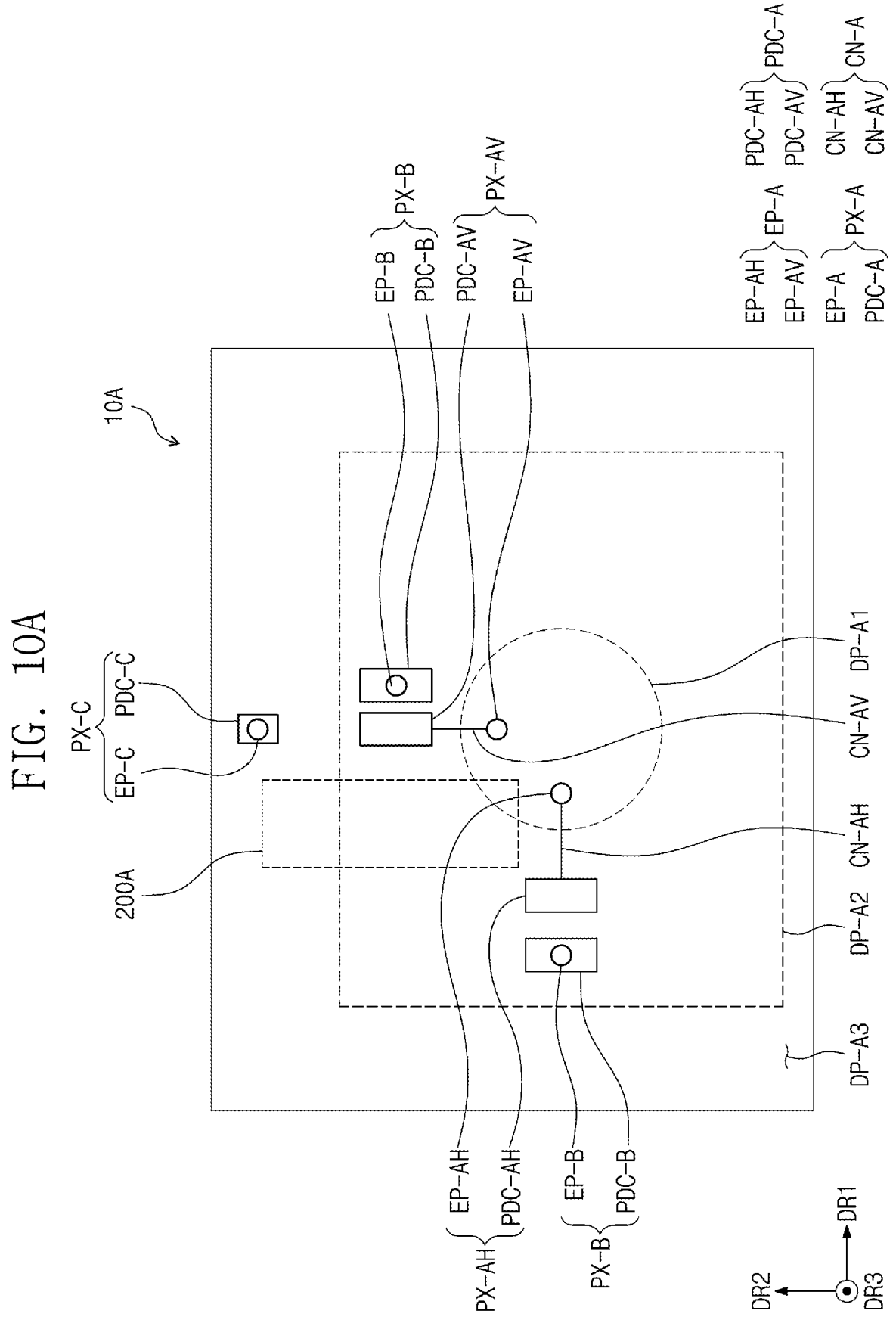
FIG. 10A is an enlarged schematic plan view of a portion of FIG. 5A.
Figure 10B:
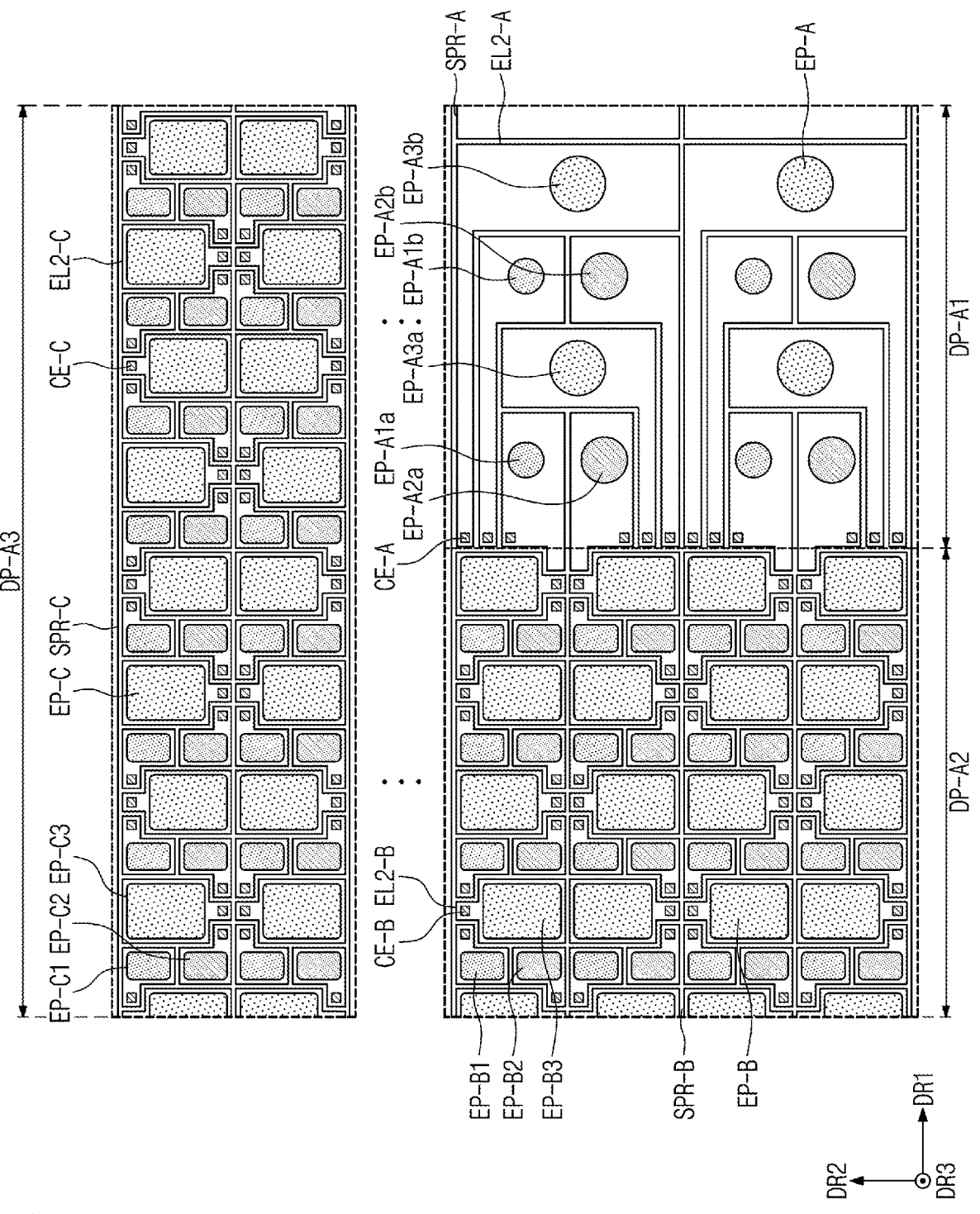
FIG. 10B is an enlarged schematic plan view of a portion of FIG. 10A.
Figure 10C:
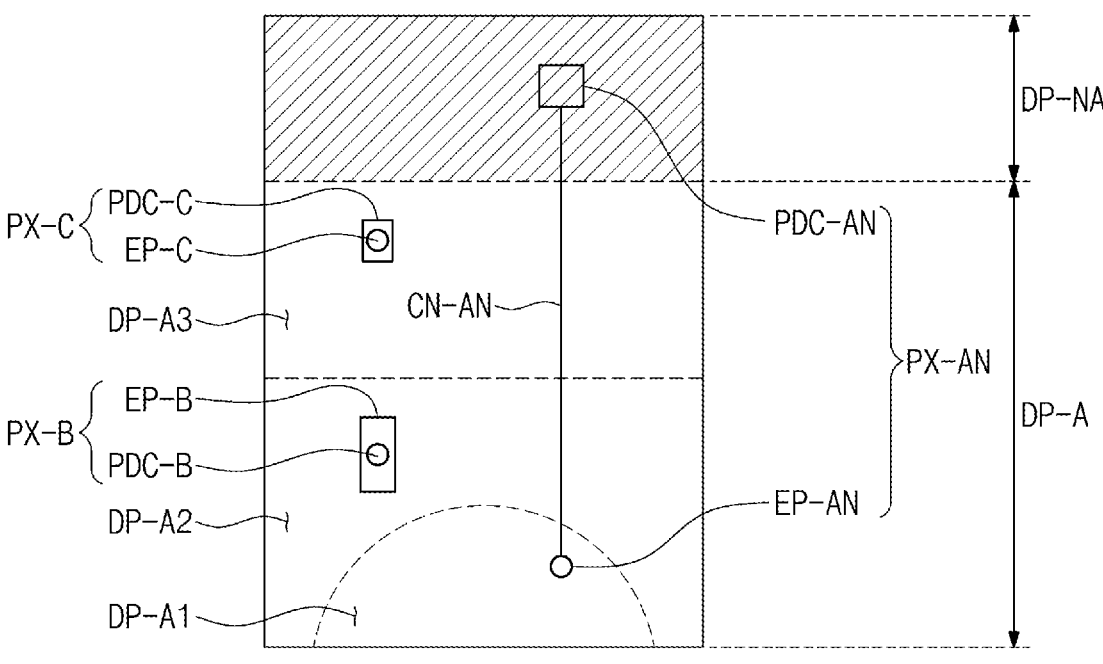
FIG. 10C is a schematic plan view of a display panel according to an embodiment.
Figure 10C:
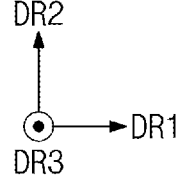

FIG. 10A is an enlarged schematic plan view of a portion 10A of FIG. 5A. FIG. 10B is an enlarged schematic plan view of a portion 200A of FIG. 10A. FIG. 10C is a schematic plan view of a display panel according to an embodiment.

Referring to FIG. 10A, the first group of pixels PX-A may include a first area light emitting part EP-A and a first area pixel driver PDC-A connected (e.g., electrically connected) to the first area light emitting part EP-A. The second group of pixels PX-B may include a second area light emitting part EP-B and a second area pixel driver PDC-B connected (e.g., electrically connected) to the second area light emitting part EP-B, and the third group of pixels PX-C may include a third area light emitting part EP-C and a third area pixel driver PDC-C connected (e.g., electrically connected) to the third area light emitting part EP-C.

The first area light emitting part EP-A may be disposed in the first area DP-A1, and the first area pixel driver PDC-A may be disposed in the second area DP-A2. The second area light emitting part EP-B and the second area pixel driver PDC-B may be disposed in the second area DP-A2. The third area light emitting part EP-C and the third area pixel driver PDC-C may be disposed in the third area DP-A3.

According to an embodiment, by moving the first area pixel driver PDC-A from the first area DP-A1 to the second area DP-A2, the light transmittance of the first area DP-A1 may be higher than that of the second area DP-A2. In case that the light-blocking structure such as a transistor is removed, the occupancy rate of the transmission area may be increased, and as a result, the light transmittance of the first area DP-A1 may be improved.

FIG. 10A shows two types of first area pixels PX-A as an example. A first area pixel PX-AH may include a first area light emitting part EP-AH disposed to be spaced apart from the first area pixel driver PDC-AH in the first direction DR1. Another first area pixel PX-AV may include a first area light emitting part EP-AV disposed apart from the first area pixel driver PDC-AV in the second direction DR2. For example, the first area pixel PX-A disposed on the right side of the center of the first area DP-A1 may have a disposition relationship between the first area light emitting part EP-AH and the first area pixel driver PDC-AH, like the first area pixels PX-AH disposed on the left side of the center of the first area DP-A1. For example, the first area pixels PX-A disposed on the lower side of the center of the first area DP-A1 may have a disposition relationship between the first area light emitting part EP-AV and the first area pixel driver PDC-AV, like the first group of pixels PX-AV disposed on the upper side of the center of the first area DP-A1.

In order to ensure an area in the second area DP-A2 where the first area pixel driver PDC-A is disposed, within the reference area, fewer second area light emitting parts EP-B may be disposed than third area light emitting parts EP-C. For example, the first area pixel driver PDC-A may be disposed in an area in the second area DP-A2 where the second area pixel driver PDC-B is not disposed.

The first area light emitting part EP-A may be connected (e.g., electrically connected) to the first area pixel driver PDC-A through the connection line CN-A. An upper connection line CN-AV connecting the first area light emitting part EP-AV disposed on the upper side and the first area pixel driver PDC-AV and a left connection line CN-AH connecting a first area light emitting part EP-AH disposed on the left side and a first area pixel driver PDC-AH are illustrated as an example. The upper connection line CN-AV and the left connection line CN-AH may extend in different directions. However, this is shown by way of example, and in an embodiment, the connection line CN-A may extend to the inside of the first area DP-A1 and may be connected to the first area light emitting part EP-A. However, this is shown as an example, and the connection part with the first area light emitting part EP-A may be disposed along the boundary between the first area DP-A1 and the second area DP-A2, or may be disposed in the second area DP-A2, or may be disposed in a distributed manner in the first area DP-A1 and the second area DP-A2. The connection position of the connection line CN-A and the first area light emitting part EP-A may be designed in various arrangement relationships, but embodiments are not limited thereto.

In FIG. 10B, cathodes (or second electrodes) of the emission element, light emitting parts EP-A, EP-B, and EP-C, separators SPR-A, SPR-B, and SPR-C, and emission connection parts CE-A, CE-B, and CE-C are shown. In order to improve the light transmittance of the first area DP-A1, fewer first area light emitting parts EP-A may be disposed than third area light emitting parts EP-C within the reference area. For example, the resolution of the first area DP-A1 may be about ½, ⅜, ⅓, ¼, ⅖, ⅛, ⅑, or 1/16 of the resolution of the third area DP-A3. For example, the resolution of the third area DP-A3 may be about 400 ppi or more, and the resolution of the first area DP-A1 may be about 200 ppi or about 100 ppi. However, this is only an example and embodiments are not limited thereto.

In an embodiment, the first area light emitting part EP-A may have a planar shape different from that of the second area light emitting part EP-B or the third area light emitting part EP-C. For example, as shown in FIG. 10B, the first area light emitting part EP-A may have a circular shape in a plan view, and the second area light emitting part EP-B or the third area light emitting part EP-C may have a rectangular shape (or a rectangular shape with rounded corners) in a plan view. However, this is shown as an example, and the first area light emitting part EP-A may have the same shape as the second area light emitting part EP-B or the third area light emitting part EP-C, but embodiments are not limited thereto.

FIG. 10B shows drawing symbols of six first area light emitting parts EP-A1$a$, EP-A2$a$, EP-A3$a$, EP-A1$b$, EP-A2$b$, and EP-A3$b$ among the first area light emitting parts EP-A for descriptive convenience. The six first area light emitting parts EP-A1$a$, EP-A2$a$, EP-A3$a$, EP-A1$b$, EP-A2$b$, and EP-A3$b$ may be light emitting parts forming the same pixel row.

Among the six first area light emitting parts EP-A1$a$, EP-A2$a$, EP-A3$a$, EP-A1$b$, EP-A2$b$, and EP-A3$b$, the three first area light emitting parts EP-A1$a$, EP-A2$a$, and EP-A3$a$ may form a light emitting part (e.g., a single light emitting part), and the remaining three first area light emitting parts EP-A1$b$, EP-A2$b$, and EP-A3$b$ may form another light emitting part. For example, the first area light emitting parts EP-A1$a$ and EP-A1$b$ in the first area DP-A1, the second area light emitting part EP-B1 in the second area DP-A2, and the third area light emitting part EP-C1 in the third area DP-A3 may emit light of colors corresponding to each other, the first area light emitting parts EP-A2$a$ and EP-A2$b$ in the first area DP-A1, the second area light emitting part EP-B2 in the second area DP-A2, and the third area light emitting part EP-C2 in the third area DP-A3 may emit light of colors corresponding to each other, and the first area light emitting parts EP-A3$a$ and EP-A3$b$ in the first area DP-A1, the second area light emitting part EP-B3 in the second area DP-A2, and the third area light emitting part EP-C3 in the third area DP-A3 may emit light of colors corresponding to each other.

In an embodiment, the area occupied by the light emitting parts in the first area DP-A1 may be smaller than the area occupied by the light emitting parts in the second area DP-A2, and may be smaller than the area occupied by the light emitting parts in the third area DP-A3. For example, the width in the second direction DR2 occupied by one pixel row where six first area light emitting parts EP-A1$a$, EP-A2$a$, EP-A3$a$, EP-A1$b$, EP-A2$b$, and EP-A3$b$ are arranged in the first area DP-A1 may correspond to the width in the second direction DR2 occupied by the two pixel rows in the second area DP-A2. For example, the width in the first direction DR1 occupied by one light emitting part where three first area light emitting parts EP-A1$a$, EP-A2$a$, and EP-A3$a$, or EP-A1$b$, EP-A2$b$, and EP-A3$b$ are arranged in the first area DP-A1 may substantially correspond to the width in the first direction DR1 occupied by the two light emitting parts in the third area DP-A3. For example, an area in which the first area light emitting parts EP-A are arranged in one row and two columns may correspond to an area in which third area light emitting parts EP-C are arranged in two rows and four columns. Accordingly, the area occupied by the light emitting parts in the first area DP-A1 may be reduced as compared to the second area DP-A2 or the third area DP-A3, so that the light transmittance of the first area DP-A1 may be improved as compared to other areas DP-A2 and DP-A3. However, this is shown as an example, and in case that the light transmittance of the first area DP-A1 is higher than that of the other areas DP-A2 and DP-A3, the shape and arrangement of the first area light emitting parts EP-A1$a$, EP-A2$a$, EP-A3$a$, EP-A1$b$, EP-A2$b$, and EP-A3$b$ may be variously changed, and embodiments are not limited thereto.

As described above, the second electrodes EL2-A, EL2-B, and EL2-C may be divided by the separators SPR-A, SPR-B, and SPR-C, respectively. The first area second electrodes EL2-A may be divided by the first area separator SPR-A and disposed overlapping each first area light emitting part EP-A. The second area second electrodes EL2-B may be divided by the second area separator SPR-B and disposed overlapping each second area light emitting part EP-B. The third area second electrodes EL2-C may be divided by the third area separator SPR-C and disposed overlapping each third area light emitting part EP-C.

The first to third area separators SPR-A, SPR-B, and SPR-C may have an integral shape connected to each other. However, the first to third area separators SPR-A, SPR-B, and SPR-C may divide the second electrodes EL2-A, EL2-B, and EL2-C of each area DP-A1, DP-A2, and DP-A3 into independent shapes in a plan view. For example, the first area separator SPR-A of the first area DP-A1 may have a different shape from the second area separator SPR-B of the second area DP-A2 or the third area separator SPR-C of the third area DP-A3. Accordingly, the first area second electrodes EL2-A may be divided into a shape and arrangement different from those of the second area second electrodes EL2-B or the third area second electrodes EL2-C. The second area separator SPR-B and the third area separator SPR-C may have the same shape. Accordingly, the second area second electrodes EL2-B and the third area second electrodes EL2-C may be divided into shapes and arrangements corresponding to each other. This is shown as an example, and in case that the second electrodes EL2-A, EL2-B, and EL2-C of each area DP-A1, DP-A2, and DP-A3 are divided, the first to third area separators SPR-A, SPR-B, and SPR-C may be independently designed for each area DP-A1, DP-A2, and DP-A3 and embodiments are not limited thereto.

FIG. 10B shows emission connection parts CE-A, CE-B, and CE-C, respectively. As described above, the emission connection parts CE-A, CE-B, and CE-C may be respectively provided to corresponding second electrodes EL2-A, EL2-B, and EL2-C. Each of the emission connection parts CE-A, CE-B, and CE-C may be an end portion of a connection line connecting the corresponding pixel driver and the second electrode. The arrangement of the emission connection parts CE-B of the second area DP-A2 may correspond to the arrangement of the emission connection parts CE1, CE2, and CE3 of FIG. 6A. The arrangement of the emission connection parts CE-C of the third area DP-A3 may correspond to the arrangement of the emission connection parts CE1, CE2, and CE3 of FIG. 6A.

The emission connection parts CE-A of the first area DP-A1 may have a different arrangement from the emission connection parts CE-B of the second area DP-A2 or the emission connection parts CE-C of the third area DP-A3. The emission connection parts CE-A of the first area DP-A1 may be arranged along the boundary between the first area DP-A1 and the second area DP-A2. Along the boundary between the first area DP-A1 and the second area DP-A2 defined by extending in the direction parallel to the second direction DR2, it is illustrated in FIG. 10B that the emission connection parts CE-A of the first area DP-A1 are arranged in a direction parallel to the second direction DR2.

The emission connection parts CE-A of the first area DP-A1 may be defined by an end portion of the connection line CN (see FIG. 6A), and by arranging the emission connection parts CE-A of the first area DP-A1 to be as close to the second area DP-A2 as possible, the length of the connection line CN connected to the pixel driver of the first area DP-A1 disposed in the second area DP-A2 may be minimized. Accordingly, power consumption for driving the first area light emitting parts EP-A in the first area DP-A1 may be reduced.

For example, by arranging the emission connection parts CE-A of the first area DP-A1 to be as close to the second area DP-A2 as possible, the connection line CN may be prevented from being disposed within the first area DP-A1. Accordingly, interference between the light passing through the first area DP-A1 and the connection line CN may be prevented and in case that the connection line CN is opaque, a problem in which light transmittance in the first area DP-A1 is lowered due to the connection line CN may be prevented. This is shown as an example, the emission connection parts CE-A of the first area DP-A1 may be formed in various positions as long as they may be provided to the first area second electrodes EL2-A of the first area DP-A1, and embodiments are not limited thereto.

Referring to FIG. 10C, a first area pixel driver PDC-A may be disposed in a fourth area other than the first area DP-A1, the second area DP-A2, and the third area DP-A3. For example, a first area pixel PX-AN may include a first area pixel driver PDC-AN and a first area light emitting part EP-AN. As shown in FIG. 10C, the first area pixel driver PDC-AN may be disposed in the peripheral area DP-NA. For example, a connection line CN-AN connecting the first area pixel driver PDC-AN and the first area light emitting part EP-AN may overlap the first area DP-A1, the second area DP-A2, the third area DP-A3, and the peripheral area DP-NA. In the display panel according to an embodiment, the first area light emitting parts EP-A and EP-AN and the first area pixel drivers PDC-A and PDC-AN disposed in areas other than first area DP-A1 may be connected through connection lines CN-A and CN-AN. Accordingly, it is possible to prevent the optically opaque pixel driver from being disposed in the first area DP-A1, thereby providing a display panel including the first area DP-A1 having high light transmittance.

Figure 11A:
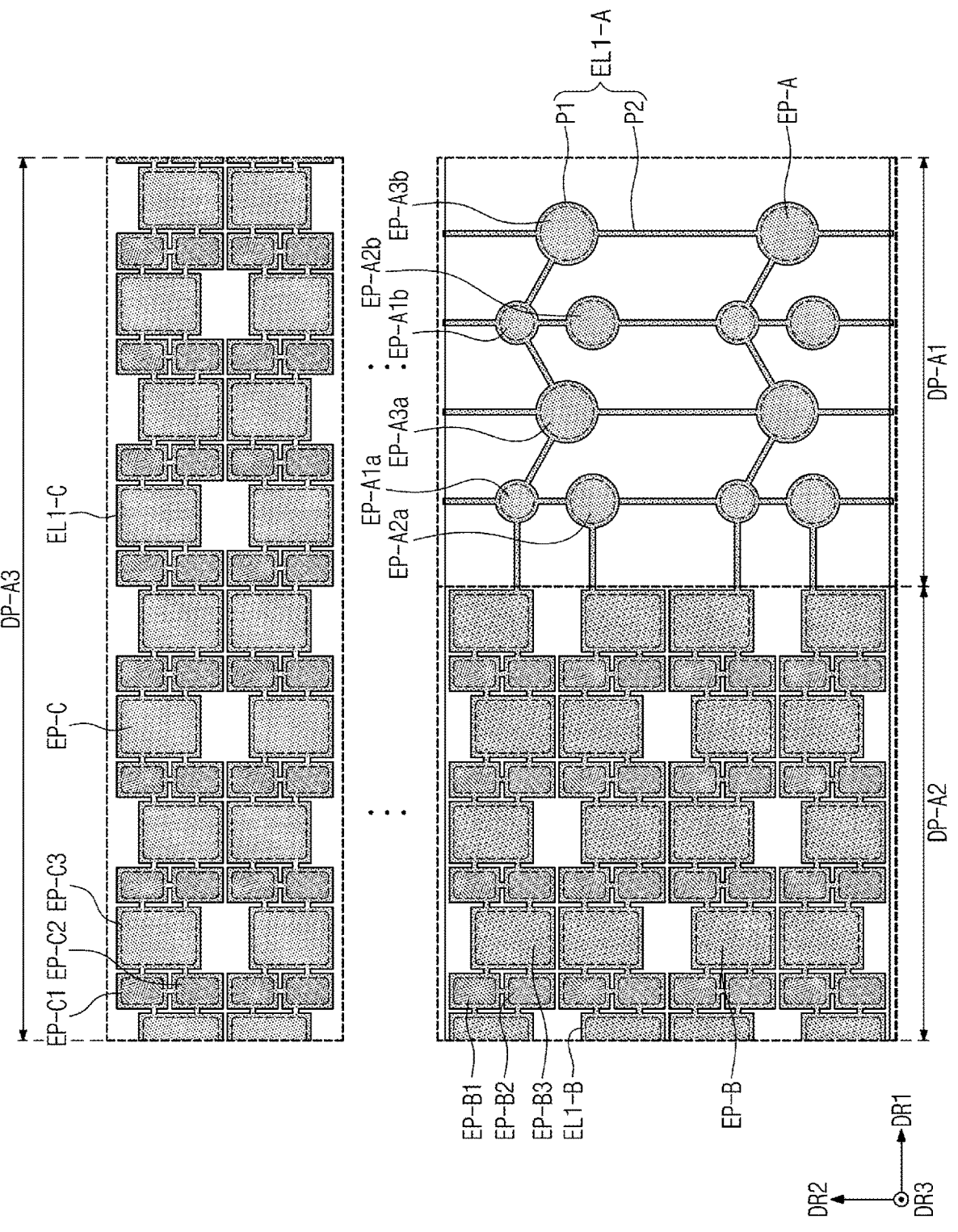
FIGS. 11A and 11B are schematic plan views of a display panel according to an embodiment.
Figure 11B:
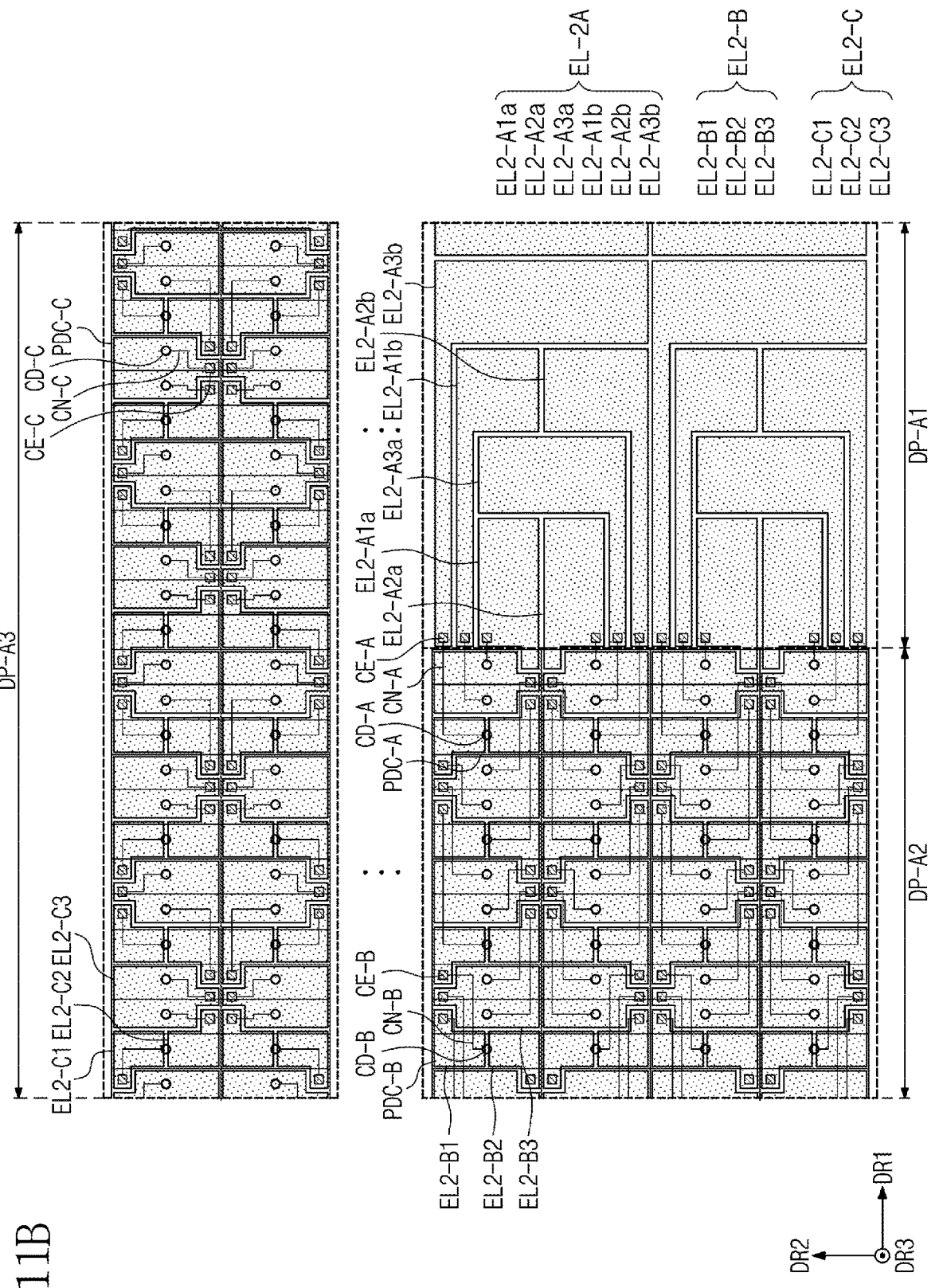

FIGS. 11A and 11B are schematic plan views of a display panel according to an embodiment. FIGS. 11A and 11B show schematic plan views of the different layers. For example, FIG. 11A is a schematic plan view of a layer on which the first electrodes EL1-A, EL1-B, and EL1-C are disposed, and FIG. 11B is a schematic plan view of a layer on which the second electrodes EL2-A, EL2-B, and EL2-C are disposed. For example, FIGS. 11A and 11B show areas corresponding to those of FIG. 10B, and corresponding light emitting parts EP-A, EP-B, and EP-C are shown with dotted lines. Hereinafter, redundant descriptions will be omitted for descriptive convenience.

As shown in FIG. 11A, the first electrode EL1-A of the first area DP-A1 disposed in the first area DP-A1, the first electrode EL1-B of the second area DP-A2 disposed in the second area DP-A2, and the first electrode EL1-C of the third area DP-A3 disposed in the third area DP-A3 may be provided in an integral shape connected to each other. The first electrodes EL1-B and EL1-C of the second area DP-A2 and the third area DP-A3 may have a shape corresponding to that of the first electrode EL1 shown in FIG. 6C.

The first electrode EL1-A of the first area DP-A1 disposed in the first area DP-A1 may include a first part P1 and a second part P2. The first part P1 and the second part P2 may have an integral shape connected to each other. The first part P1 may be provided in plural and may be arranged to overlap each of the first area light emitting parts EP-A1a, EP-A2a, EP-A3a, EP-A1b, EP-A2b, and EP-A3b. The first part P1 is shown in the same circular shape as the corresponding light emitting part, but embodiments are not limited thereto and may be provided in various shapes as long as it may overlap the entire corresponding light emitting part.

The second part P2 may connect adjacent first parts P1. For example, the second part P2 may connect the adjacent first part P1 and the first electrode EL1-B of the second area DP-A2. The second part P2 may have a bar shape, but embodiments are not limited thereto. According to an embodiment, since the first electrode EL1-A of the first area DP-A1 includes the first part P1 and the second part P2, the area occupied within the first area DP-A1 may be minimized. Accordingly, in areas other than the first area light emitting parts EP-A1a, EP-A2a, EP-A3a, EP-A1b, EP-A2b, and EP-A3b in the first area DP-A1, since the area, in which the optically opaque first electrode EL1-A is disposed, is minimized, the light transmittance of the first area DP-A1 may be improved.

As shown in FIG. 11B, each of the second electrodes EL2-A, EL2-B, and EL2-C may be provided in a plurality of divided patterns. As described above, the second electrodes EL2-A, EL2-B, and EL2-C may be divided by the separators SPR-A, SPR-B and SPR-C. In another example, some of the second electrodes EL2-A, EL2-B, and EL2-C may be patterned and formed through a separate mask.

FIG. 11B shows connection lines CN-A, CN-B, and CN-C, emission connection parts CE-A, CE-B, and CE-C, and driver connection parts CD-A, CD-B, and CD-C together for descriptive convenience. As mentioned above, the emission connection parts CE-A, CE-B, and CE-C may be parts connected to the second electrodes EL2-A, EL2-B, and EL2-C among the connection lines CN-A, CN-B, and CN-C, and the driver connection parts CD-A, CD-B, and CD-C may be parts connected to pixel drivers PDC-A, PDC-B, and PDC-C among the connection lines CN-A, CN-B, and CN-C. For distinction from the emission connection parts CE-A, CE-B, and CE-C, the driver connection parts CD-A, CD-B, and CD-C are each shown in a circular shape.

The three third area second electrodes EL2-C1, EL2-C2, and EL2-C3 belonging to one light emitting part among the third area second electrodes EL2-C disposed in the third area DP-A3 may overlap three third area pixel drivers PDC-C belonging to the corresponding light emitting part in a plan view. Based on one light emitting part, the third area second electrodes EL2-C1, EL2-C2, and EL2-C3 and the third area pixel drivers PDC-C may be disposed within the boundary range of the light emitting part and may overlap each other.

The third area connection line CN-C may connect the corresponding third area second electrode EL2-C among the third area second electrodes EL2-C1, EL2-C2, and EL2-C3 to the third area pixel driver PDC-C. The third area connection lines CN-C may be spaced apart in a plan view so as not to interfere with each other. The average length of the third area connection line CN-C in the third area DP-A3 may be relatively shorter than that in the first area DP-A1 or the second area DP-A2.

The three second area second electrodes EL2-B1, EL2-B2, and EL2-B3 belonging to a light emitting part (e.g., single light emitting part) among the second area second electrodes EL2-B disposed in the second area DP-A2 may be spaced apart from three second area pixel drivers PDC-B belonging to the corresponding light emitting part in a plan view. For example, based on one light emitting part, the second area second electrodes EL2-B1, EL2-B2, and EL2-B3 and the second area pixel drivers PDC-B may be partially shifted in the first direction DR1.

The second area connection line CN-B may connect the corresponding second area second electrode EL2-B among the second area second electrodes EL2-B1, EL2-B2, and EL2-B3 to the second area pixel driver PDC-B. The second area connection lines CN-B may be spaced apart from each other in a plan view so as not to interfere with each other. The average length of the second area connection line CN-B in the second area DP-A2 may be relatively longer than that in the third area DP-A3.

The first area second electrodes EL2-A1$a$, EL2-A2$a$, EL2-A3$a$, EL2-A1$b$, EL2-A2$b$, and EL2-A3$b$ disposed in the first area DP-A1 may be spaced apart from the corresponding first area pixel drivers PDC-A in a plan view. In an embodiment, among the pixel drivers PDC-A and PDC-B disposed along the first direction DR1 in the second area DP-A2, three first area pixel drivers PDC-A adjacent to the first area DP-A1 may be pixel drivers connected to the first area second electrodes EL2-A1$a$, EL2-A2$a$, EL2-A3$a$, EL2-A1$b$, EL2-A2$b$, and EL2-A3$b$ disposed in the first area DP-A1. For example, among the pixel drivers PDC-A and PDC-B disposed in the second area DP-A2, the first area pixel drivers PDC-A of three columns adjacent to the first area DP-A1 may be connected to the first area second electrodes EL2-A1$a$, EL2-A2$a$, EL2-A3$a$, EL2-A1$b$, EL2-A2$b$, and EL2-A3$b$ of the first area DP-A1, and the second area pixel drivers PDC-B of the remaining columns may be connected to the second area second electrodes EL2-B1, EL2-B2, and EL2-B3 of the second area DP-A2.

In an embodiment, both the first area connection line CN-A and the second area connection line CN-B may be disposed in the second area DP-A2. The second area connection line CN-B may connect the corresponding second area second electrode EL2-B among the second area second electrodes EL2-B1, EL2-B2, and EL2-B3 to the second area pixel driver PDC-B. An end portion of the second area connection line CN-B may be the second area driver connection part CD-B of the second area DP-A2, and another end portion of the second area connection line CN-B may be the emission connection part CE-B of the second area DP-A2. The second area connection lines CN-B may be spaced apart from each other in a plan view so as not to interfere with each other. The average length of the second area connection line CN-B in the second area DP-A2 may be relatively longer than that in the third area DP-A3.

The first area connection line CN-A may connect the corresponding first area second electrode EL2-A among the first area second electrodes EL2-A1$a$, EL2-A2$a$, EL2-A3$a$, EL2-A1$b$, EL2-A2$b$, and EL2-A3$b$ to the first area pixel driver PDC-A. An end portion of the first area connection line CN-A may be the first area driver connection part CD-A of the first area DP-A1, and another end portion of the first area connection line CN-A may be the emission connection part CE-A of the first area DP-A1. The first area connection lines CN-A may be spaced apart from each other in a plan view so as not to interfere with each other. Accordingly, the order in which the first area driver connection parts CD-A are arranged along the first direction DR1 and the order in which the second area driver connection parts CD-B are arranged along the first direction DR1 may be different from each other. However, this is shown as an example, according to the shape of the first area second electrodes EL2-A1$a$, EL2-A2$a$, EL2-A3$a$, EL2-A1$b$, EL2-A2$b$, and EL2-A3$b$, the position of the emission connection part CE-A in the first area DP-A1, or the inter-floor position of the first area connection line CN-A, the order in which the first area driver connection parts CD-A are arranged along the first direction DR1 and the order in which the second area driver connection parts CD-B are arranged along the first direction DR1 may be designed identically to each other, and embodiments are not limited thereto.

For example, in an embodiment, the first area driver connection parts CD-A may be arranged to be relatively adjacent to the first area DP-A1 as compared to the second area driver connection parts CD-B. Accordingly, the length of the first area connection line CN-A may be minimized, so that the electrical driving efficiency of the first area light emitting part EP-A may be increased. However, this is shown as an example, and in case that the first area driver connection parts CD-A are placed in an area other than the first area DP-A1, the first area driver connection parts CD-A may be disposed between the second area driver connection parts CD-B or may be disposed in a peripheral area DP-NA (see FIG. 10C), but embodiments are not limited thereto.

Figure 12:
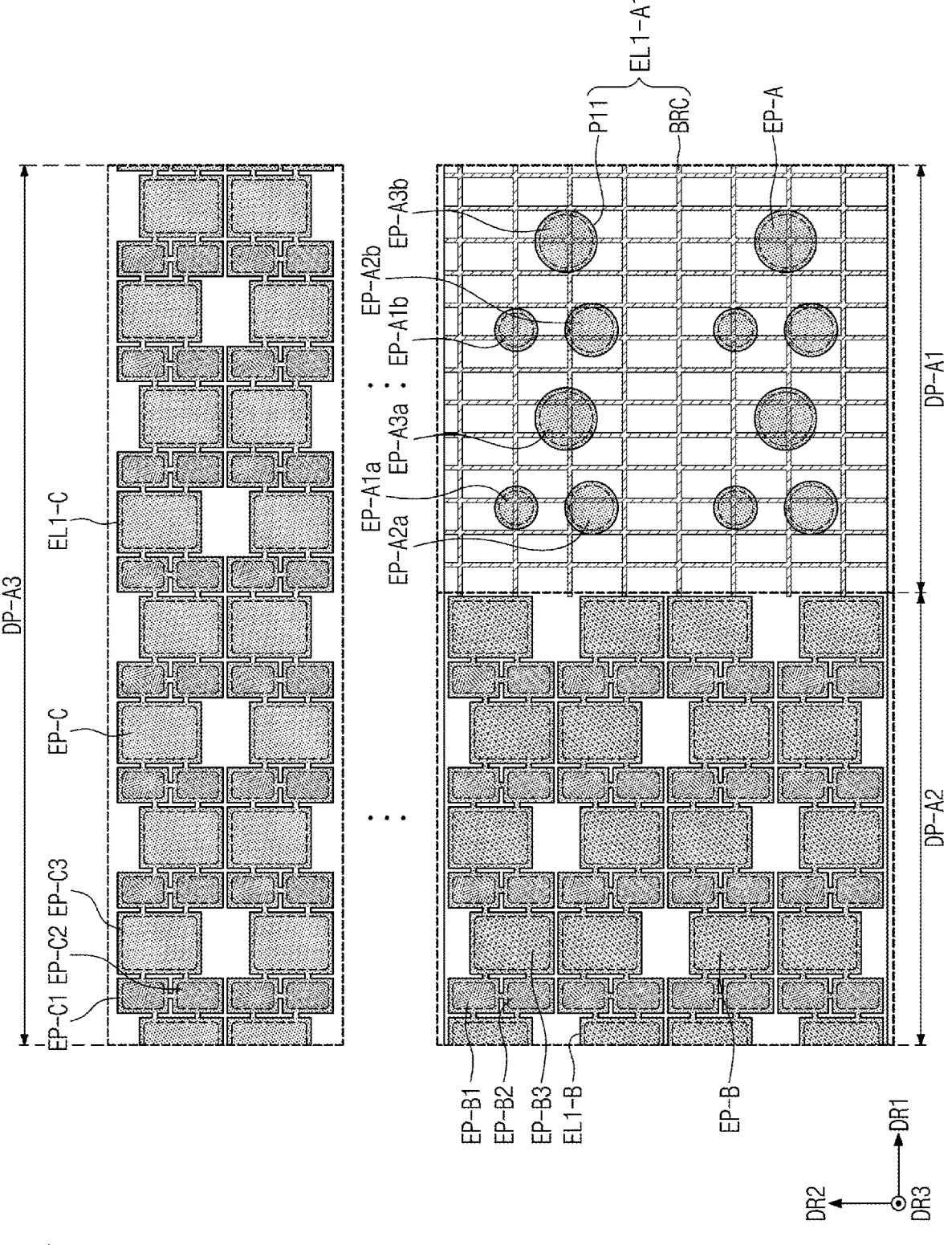
FIG. 12 is a schematic plan view of a display panel according to an embodiment.

FIG. 12 is a schematic plan view of a display panel according to an embodiment. FIG. 12 shows a first electrode and shows an area corresponding to FIG. 11A. Hereinafter, an embodiment will be described with reference to FIG. 12, and redundant description will be omitted for descriptive convenience.

Referring to FIG. 12, the first area first electrode EL1-A1 of the first area DP-A1 may include first patterns P11 and a connection pattern BRC. The first patterns P11 and the connection pattern BRC may be disposed on different layers. For descriptive convenience, the first patterns P11 and the connection pattern BRC disposed on different layers are illustrated with different shades.

The first patterns P11 may be disposed on the same layer as the second area first electrode EL1-B in the second area DP-A2 or the third area first electrode EL1-C in the third area DP-A3. The second area first electrode EL1-B in the second area DP-A2 and the third area first electrode EL1-C in the third area DP-A3 may have an integral shape. The first patterns P11 may be spaced apart from the second area first electrode EL1-B in the second area DP-A2 and the third area first electrode EL1-C in the third area DP-A3.

The connection pattern BRC may connect (e.g., electrically connect) the first patterns P11 and the second area first electrode EL1-B of the second area DP-A2. Accordingly, first patterns P11 and the second area first electrode EL1-B of the second area DP-A2 may receive substantially the same voltage. The connection pattern BRC and the first patterns P11 may be disposed on different layers, respectively. For example, the connection pattern BRC may be disposed on the same layer as one of the connection line CN (see FIG. 7), the first capacitor electrode CPE1 (see FIG. 7), the second capacitor electrode CPE2 (see FIG. 7), the third capacitor electrode CPE3 (see FIG. 7), the source electrode pattern W1 (see FIG. 7), the semiconductor pattern SP (see FIG. 7), and the lower conductive layer BCL (see FIG. 7). In another example, an additional insulating layer may be further provided and disposed on a layer different from that of the above-described conductive patterns W1, W2, CPE1, CPE2, CPE3, and BCL. The connection pattern BRC may be disposed on various layers as long as it is disposed on a layer different from that of the first patterns P11 or the second area first electrode EL1-B of the second area DP-A2, but embodiments are not limited thereto.

The connection pattern BRC may have a mesh shape. For example, the connection pattern BRC may include conductive lines extending in the first direction DR1 and conductive lines extending in the second direction DR2. The conductive lines may have an integral shape connected to each other. The first patterns P11 may be connected to or contact (e.g., directly contact) the connection pattern BRC through a contact hole. The connection pattern BRC may be disposed above or below the first patterns P11 in a cross-sectional view. The connection pattern BRC may have various shapes in case that it overlaps the first patterns P11 in a plan view and electrically connects the first patterns P11 and the second area first electrode EL1-B of the second area DP-A2, but embodiments are not limited thereto.

The connection pattern BRC may be optically transparent. Accordingly, in case that the connection pattern BRC is disposed in the first area DP-A1, the optical effect on the first area DP-A1 may be small. In another example, the connection pattern BRC may be optically opaque. For example, by forming the connection pattern BRC in a mesh shape, the actual area occupied in the first area DP-A1 may be minimized, and it is possible to minimize interference with respect to the degree of visibility by the user or the amount of light passing through the first area DP-A1.

According to an embodiment, the first patterns P11 may be disposed only at positions overlapping first area light emitting parts EP-A1a, EP-A2a, EP-A3a, EP-A1b, EP-A2b, and EP-A3b in the first area DP-A1, and the mesh-shaped connection pattern BRC may be disposed in the remaining areas, so that an area occupied by the first patterns P11 in the first area DP-A1 may be reduced. Accordingly, in case that the first patterns P11 are optically opaque, the first area DP-A1 having improved light transmittance may be provided.

Figure 13A:
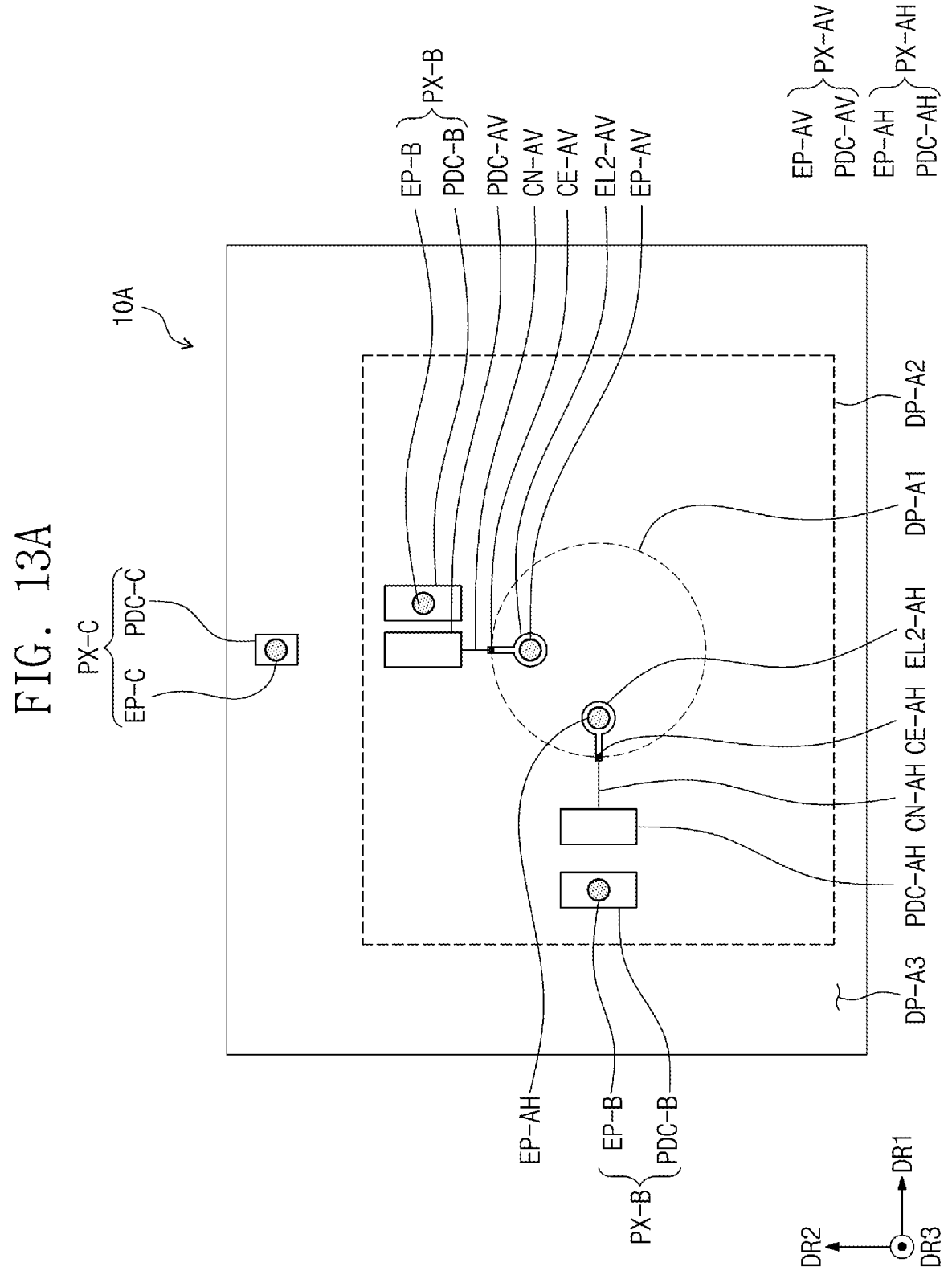
FIGS. 13A and 13B are enlarged schematic plan views of a portion of a display panel according to an embodiment.
Figure 13B:
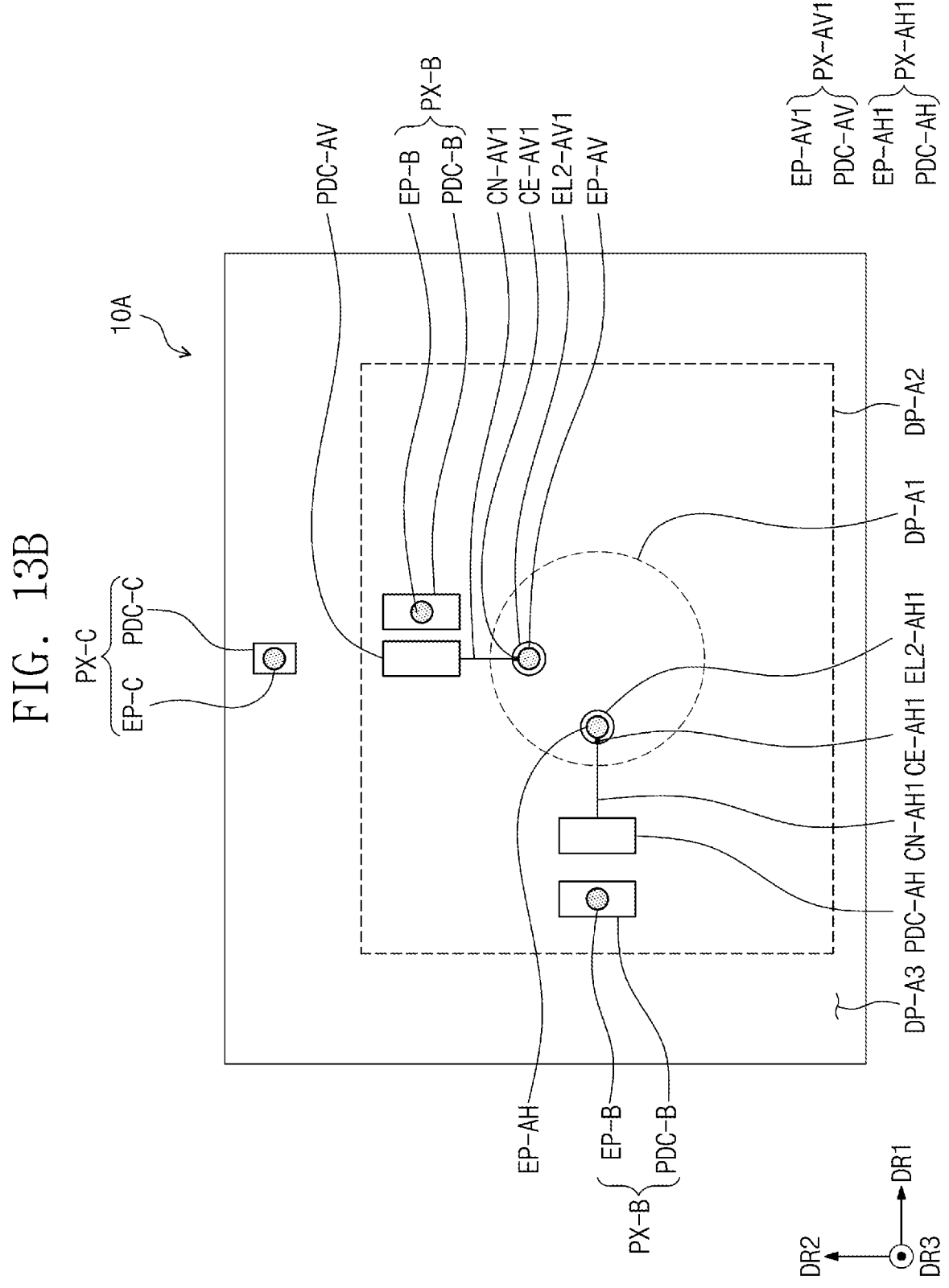

FIGS. 13A and 13B are enlarged schematic plan views of a portion of a display panel according to an embodiment. FIGS. 13A and 13B show an area corresponding to that of FIG. 10A, with some components added thereto. Hereinafter, the embodiment will be described with reference to FIGS. 13A and 13B, and redundant descriptions will be omitted for descriptive convenience.

As shown in FIG. 13A, the two types of first area pixels PX-AH and PX-AV may include first area light emitting parts EP-AH and EP-AV and first area pixel drivers PDC-AH and PDC-AV connected by first area connection lines CN-AH and CN-AV, respectively. The first area connection lines CN-AH and CN-AV may be connected to the first area light emitting parts EP-AH and EP-AV through emission connection parts CE-AH and CE-AV connected to the first area second electrodes EL2-AH and EL2-AV. For example, the emission connection parts CE-AH and CE-AV may be disposed along the boundary between the first area DP-A1 and the second area DP-A2. The first area second electrodes EL2-AH and EL2-AV of the first area DP-A1 may be disposed in the first area DP-A1, and the first area connection lines CN-AH and CN-AV may be disposed in the second area DP-A2. According to an embodiment, the first area connection lines CN-AH and CN-AV may not overlap the first area DP-A1.

As shown in FIG. 13B, in each of the two types of first area pixels PX-AH1 and PX-AV1, the first area light emitting parts EP-AH1 and EP-AV1 may be connected to the first area pixel drivers PDC-AH and PDC-AV by the first area connection lines CN-AH1 and CN-AV1 via the first area DP-A1. In an embodiment, the emission connection parts CE-AH1 and CE-AV1 may be disposed in the first area DP-A1. Accordingly, the first area connection lines CN-AH1 and CN-AV1 may extend from the second area DP-A2 to the first area DP-A1. By providing emission connection parts CE-AH1 and CE-AV1 in the first area DP-A1, the first area connection lines CN-AH1 and CN-AV1 may overlap the first area DP-A1, but areas occupied by the first area second electrodes EL2-AH1 and EL2-AV1 in the first area DP-A1 may be reduced.

According to an embodiment, the first area pixels PX-AH, PX-AV, PX-AH1, and PX-AV1 may be connected to the first area pixel drivers PDC-AH and PDC-AV disposed in the second area DP-A2 through the first area connection lines CN-AH, CN-AV, CN-AH1, and CN-AV1. Therefore, since the first area pixel drivers PDC-AH and PDC-AV corresponding to the light blocking structure are disposed in the first area DP-A1 in a non-overlapping manner, a display panel including the first area DP-A1 having a relatively high light transmittance may be provided.

According to an embodiment, an area of an emission element in an area where an electronic optical module is disposed may be reduced. Accordingly, the light transmittance of the area where the electronic optical module is disposed may be improved.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display panel comprising:
   a first pixel including a first light emitting part disposed in a first area and a first pixel driver disposed in a second area different from the first area;
   a second pixel including a second light emitting part disposed in the second area and a second pixel driver disposed in the second area;
   a first connection line connecting the first light emitting part and the first pixel driver; and
   a second connection line connecting the second light emitting part and the second pixel driver, wherein
   each of the first light emitting part and the second light emitting part comprises:
      a first electrode;
      an intermediate layer disposed on the first electrode and including a light emitting material; and
      a second electrode disposed on the intermediate layer,
   each of the first connection line and the second connection line comprises:

a driver connection part connected to a corresponding pixel driver of the first pixel driver and the second pixel driver; and an emission connection part spaced apart from the driver connection part and connected to the second electrode, and the first area has a light transmittance higher than a light transmittance of the second area.

2. The display panel of claim 1, wherein the first pixel driver and the second pixel driver do not overlap the first area in a plan view.

3. The display panel of claim 2, wherein the emission connection part of the first connection line is disposed along a boundary between the first area and the second area.

4. The display panel of claim 2, wherein the emission connection part of the first connection line is disposed in the first area.

5. The display panel of claim 4, wherein the first connection line overlaps the first area in the plan view.

6. The display panel of claim 1, wherein
the first electrode is an anode, and
the second electrode is a cathode.

7. The display panel of claim 6, wherein each of the first connection line and the second connection line has an undercut shape in a cross-sectional view.

8. The display panel of claim 7, wherein
the second electrode of the first light emitting part contacts a side surface of the first connection line, and
the intermediate layer of the first light emitting part is spaced apart from the side surface of the first connection line.

9. The display panel of claim 1, further comprising:
a separator disposed between the first light emitting part and the second light emitting part,
wherein the second electrode of the first light emitting part and the second electrode of the second light emitting part are separated from each other by the separator.

10. The display panel of claim 9, wherein a shape of the separator disposed in the first area in a plan view and a shape of the separator disposed in the second area in the plan view are different from each other.

11. The display panel of claim 9, wherein the number of second electrodes per unit area in the first area is smaller than the number of second electrodes per unit area in the second area.

12. The display panel of claim 1, wherein:
the first connection line is connected to a driving transistor of the first pixel driver, and
the second connection line is connected to a driving transistor of the second pixel driver.

13. The display panel of claim 1, wherein the first electrode of the first light emitting part is integral with the first electrode of the second light emitting part.

14. The display panel of claim 1, wherein
the first electrode of the first light emitting part comprises:
a plurality of patterns spaced apart from each other; and a connection pattern connecting the plurality of patterns to each other, the connection pattern and the plurality of patterns disposed on different layers, and the first electrode of the second light emitting part is connected to the connection pattern.

15. The display panel of claim 1, further comprising:
a third pixel including a third light emitting part disposed in the first area; and
a third pixel driver disposed in a peripheral area and connected to the third light emitting part.

16. An electronic apparatus comprising:
a display panel including a first area and a second area adjacent to the first area; and
an electronic optical module overlapping the first area in a plan view, wherein
the display panel comprises:
a first pixel including a first light emitting part disposed in the first area and a first pixel driver disposed in the second area;
a second pixel including a second light emitting part disposed in the second area and a second pixel driver disposed in the second area;
a first connection line connecting the first light emitting part and the first pixel driver, the first connection line comprising a first emission connection part electrically connected to the first light emitting part; and
a second connection line connecting the second light emitting part and the second pixel driver, the second connection line comprising a second emission connection part electrically connected to the second light emitting part, and
each of the first and second emission connection parts has an undercut shape in a cross-sectional view.

17. The electronic apparatus of claim 16, wherein
the first emission connection part is arranged along a boundary between the first area and the second area, and
the first and second connection lines do not overlap the first area in the plan view.

18. The electronic apparatus of claim 16, wherein
the first emission connection part is disposed in the first area, and
the first connection line overlaps the first area in the plan view.

19. The electronic apparatus of claim 16, wherein an anode of the first light emitting part and an anode of the second light emitting part are integral with each other.

20. The electronic apparatus of claim 16, wherein
an anode of the first light emitting part comprises:
a plurality of patterns spaced apart from each other; and
a connection pattern connecting the plurality of patterns to each other, the connection pattern and the plurality of patterns disposed on different layers, and
an anode of the second light emitting part is connected to the connection pattern.

* * * * *